United States Patent
Wheeler et al.

(10) Patent No.: US 10,844,658 B2
(45) Date of Patent: Nov. 24, 2020

(54) ENERGY-HARVESTING CHROMOGENIC DEVICES

(71) Applicant: Alliance for Sustainable Energy, LLC, Golden, CO (US)

(72) Inventors: Lance Michael Wheeler, Wheat Ridge, CO (US); Joseph Matthew Luther, Boulder, CO (US); Jeffrey A. Christians, Denver, CO (US); Joseph Jonathan Berry, Boulder, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 187 days.

(21) Appl. No.: 15/906,696

(22) Filed: Feb. 27, 2018

(65) Prior Publication Data
US 2018/0252028 A1    Sep. 6, 2018

Related U.S. Application Data

(60) Provisional application No. 62/463,850, filed on Feb. 27, 2017.

(51) Int. Cl.
| | | |
|---|---|---|
| *G02F 1/01* | (2006.01) | |
| *E06B 9/24* | (2006.01) | |
| *H01G 9/20* | (2006.01) | |
| *H01L 51/42* | (2006.01) | |

(52) U.S. Cl.
CPC .............. *E06B 9/24* (2013.01); *G02F 1/0147* (2013.01); *H01G 9/2009* (2013.01); *H01L 51/4226* (2013.01); *H01L 51/4253* (2013.01); *E06B 2009/2417* (2013.01); *E06B 2009/2476* (2013.01); *H01L 2251/306* (2013.01)

(58) Field of Classification Search
None
See application file for complete search history.

(56) References Cited

U.S. PATENT DOCUMENTS

| 3,507,563 | A |   | 4/1970 | Berman |
|---|---|---|---|---|
| 6,084,702 | A | * | 7/2000 | Byker ............... B32B 17/10036 359/288 |
| 7,660,029 | B2 |   | 2/2010 | Ashrit et al. |
| 7,737,356 | B2 |   | 6/2010 | Goldstein |
| 8,154,029 | B2 |   | 4/2012 | Liao et al. |
| 8,431,045 | B2 |   | 4/2013 | Byker et al. |
| 9,116,409 | B1 |   | 8/2015 | Sun et al. |

(Continued)

FOREIGN PATENT DOCUMENTS

WO    2016123407 A1    8/2016

OTHER PUBLICATIONS

Amboage et al., "High pressure structural study of SnnNiO3", J. Phys.: Condens. Matter 17 S783. (Year: 2005).*

(Continued)

*Primary Examiner* — Tamir Ayad
(74) *Attorney, Agent, or Firm* — Michael A. McIntyre

(57) ABSTRACT

The present disclosure relates to devices that include a perovskite, where, when a first condition is met, at least a portion of the perovskite is in a first phase that substantially transmits light, when a second condition is met, at least a portion of the perovskite is in a second phase that substantially absorbs light, and the perovskite is reversibly switchable between the first phase and the second phase by reversibly switching between the first condition and the second condition.

17 Claims, 13 Drawing Sheets

(56) References Cited

U.S. PATENT DOCUMENTS

| | | | |
|---|---|---|---|
| 10,388,897 B2* | 8/2019 | Snaith | H01L 51/4213 |
| 2006/0172135 A1 | 8/2006 | Agrawal et al. | |
| 2008/0092456 A1 | 4/2008 | Millett et al. | |
| 2009/0283728 A1 | 11/2009 | Byker et al. | |
| 2010/0051968 A1 | 3/2010 | Seo et al. | |
| 2010/0132770 A1 | 6/2010 | Beatty et al. | |
| 2011/0249314 A1 | 10/2011 | Wang et al. | |
| 2012/0292581 A1 | 11/2012 | Byker et al. | |
| 2013/0003157 A1 | 1/2013 | Wang et al. | |
| 2013/0330559 A1 | 12/2013 | Hellstrom et al. | |
| 2014/0176615 A1* | 6/2014 | Avci | G09G 5/10 345/690 |
| 2014/0327952 A1 | 11/2014 | Anderson et al. | |
| 2015/0122314 A1* | 5/2015 | Snaith | H01L 51/4213 136/255 |
| 2015/0129034 A1 | 5/2015 | Snaith et al. | |
| 2015/0228918 A1 | 8/2015 | Hiraoka et al. | |
| 2015/0243444 A1 | 8/2015 | Irwin et al. | |
| 2016/0139476 A1 | 5/2016 | Garcia et al. | |
| 2017/0089128 A1 | 3/2017 | Wheeler | |
| 2017/0179019 A1 | 6/2017 | Alur et al. | |
| 2018/0059440 A1 | 3/2018 | Yu et al. | |
| 2018/0330891 A1 | 11/2018 | Wheeler et al. | |

OTHER PUBLICATIONS

Frolova, Lyubov A. et al., "Highly Efficient All-Inorganic Planar Heterojunction Perovskite Solar Cells Produced by Thermal Coevaporation of CsI and PbI2", The Journal of Physical Chemistry Letters, ACS Publications, 8, pp. 67-72. (Year: 2016).*
Ahmad et al. "Structural, electronic and optical properties of CsPbX3 (X = Cl, Br, I) for energy storage and hybrid solar cell applications", Journal of Alloys and Compounds, 705, Feb. 20, 2017, pp. 828-839 (Year: 2017).*
Goldschmidt, Jan Christoph, "From window to solar cell and back", Nature Materials, vol. 17, Mar. 2018, pp. 210-220. (Year: 2018).*
Lin et al. "Thernnochronnic halide perovskite solar cells", Nature Materials, vol. 17, Mar. 2018, pp. 261-267. (Year: 2018).*
Cannavale et al., "Forthcoming perspectives of photoelectrochromic devices: a critical review," Energy Environ. Sci., 2016, vol. 9, pp. 2682-2719.
Eperon et al., "Neutral Color Semitransparent Microstructured Perovskite Solar Cells," ACS Nano, 2014, vol. 8, No. 1, pp. 591-59.
Huang et al., "Direct Observation of Reversible Transformation of $CH_3NH_3PbI_3$ and $NH_4PbI_3$ Induced by Polar Gaseous Molecules," Journal of Physical Chemistry Letters, 2016, vol. 7, pp. 5068-5073.
Leguy et al., "Reversible Hydration of $CH_3NH_3PbI_3$ in Films, Single Crystals, and Solar Cells," Chemistry of Materials, 2015, 11 pages.
Piccolo et al., "Performance requirements for electrochromic smart window," Journal of Building Engineering, 2015, vol. 3, pp. 94-103.
Schubert et al., "Solid-State Light Sources Getting Smart," Science, 2005, vol. 308, 6 pages.
Yuan et al., "Electric-Field-Driven Reversible Conversion Between Methylammonium Lead Triiodide Perovskites and Lead Iodide at Elevated Temperatures," Advanced Materials Views, 2016, vol. 6, 7 pages.
PCT/US18/32088 Search Report dated Jul. 12, 2018; 3 pages.
PCT/US18/32088 Written Opinion dated Jul. 12, 2018; 6 pages.
PCT/US16/54188 Search Report dated Dec. 13, 2016; 3 pages.
PCT/US16/54188 Written Opinion dated Dec. 13, 2016; 7 pages.
Search Report from corresponding PCT patent application No. PCT/US18/67435 dated Mar. 27, 2019, 3 pages.
Written Opinion from corresponding PCT patent application No. PCT/US18/67435 dated Mar. 27, 2019, 6 pages.
Ihly, R. et al., "Efficient charge extraction and slow recombination in organic-inorganic perovskites capped with semiconducting single-walled carbon nanotubes," Energy & Environmental Science, vol. 9, 2016, pp. 1439-1449.
Momblana et al., "Efficient vacuum deposited p-i-n and n-i-p provskite solar cells employing doped charge transport layers," Electronic Supplementary Information, Royal Society of Chemistry, 2016, 18 pages.
Kitazawa et al., "Optical properties of $Ch_3Nh_3PbX_2$ (X= halogen) and their mixed-halide crystals," Journal of Materials Science, vol. 37, No. 17, Dec. 1, 2002, pp. 3585-3587.
EP 16 85 2492 Supplementary Partial European Search Report dated Apr. 3, 2019, 13 pages.
Li et al., Correlated Perovskites as a New Platform for Super-Broadband-Tunable Photonics; Advanced Materials, vol. 28, Issue 41, Nov. 2, 2016, 9 pages.
NREL Energy Innovation Portal, "Design and Fabrication of Thermochromic Energy-Harvesting Windows," http://techportal.eere.energy.gov/technology.do/techID=1373, accessed Apr. 18, 2018.
International Search Report from corresponding PCT patent application No. PCT/US18/19972, dated May 30, 2018, 2 pages.
Written Opinion of the International Searching Authority from corresponding PCT patent application No. PCT/US18/19972, dated May 30, 2018, 7 pages.
Arima et al., "Variation of optical gaps in perovskite-type 3d transition-metal oxides," Physical Review B, vol. 48, No. 23, Dec. 15, 1993-I, pp. 17 006-17 009.
Beal et al., "Cesium Lead Halide Perovskites with Improved Stability for Tandem Solar Cells," The Journal of Physical Chemistry Letters, vol. 7, 2016, pp. 746-751.
Bryant et al., "A Transparent Conductive Adhesive Laminate Electrode for High-Efficiency Organic-Inorganic Lead Halide Perovskite Solar Cells," Advanced Materials, vol. 26, 2014, pp. 7499-7504.
Cottingham et al., "Compositionally Dependent Phase Identity of Colloidal $CsPbBr_{3-x}I_x$ Quantum Dots," Chemistry of Materials, vol. 28, 2016, pp. 7574-7577.
Davy et al., "Pairing of near-ultraviolet solar cells with electrochromic windows for smart management of the solar spectrum," Nature Energy, vol. 2, 2017, pp. 17104-17110.
Gao et al., "Organohalide lead perovskites for photovoltaic applications," Energy & Environmental Science, vol. 7, 2014, pp. 2448-2463.
Gorgolis et al., "Solar energy materials for glazing technologies," Solar Energy Materials & Solar Cells, vol. 144, 2016, pp. 559-578.
Granqvist, C.G., "Electrochromic devices," Journal of the European Ceramic Society, vol. 25, Issue 12, 2005, pp. 1-13.
Habisreutinger et al., "Carbon Nanotube/Polymer Composites as a Highly Stable Hole Collection Layer in Perovskite Solar Cells," Nano Letters, vol. 14, 2014, pp. 5561-5568.
Habisreutinger et al., "Dopant-Free Planar n-i-p Perovskite Solar Cells with Steady-State Efficiencies Exceeding 18%," ACS Energy Letters, vol. 2, 2017, pp. 622-628.
Halder et al., "Exploring Thermochromic Behavior of Hydrated Hybrid Perovskites in Solar Cells," American Chemical Society, Journal of Physical Chemistry Letters, vol. 6, 2015, pp. 3180-3184.
Hao et al., "Lead-free solid-state organic-inorganic halide perovskite solar cells," Nature Photonics, vol. 8, Jun. 2014, pp. 489-494.
Heo et al., "Flexible Reflective Color Displays using Thermochromic Pigments," Journal of the Optical Society of Korea, vol. 17, No. 5, Oct. 2013, pp. 428-432.
Idigoras et al., "The interaction between hybrid organic-inorganic halide perovskite and selective contacts in perovskite solar cells: an infrared spectroscopy study," Phys. Chem. Chem. Phys., vol. 18, 2016, pp. 13583-13590.
Jeon et al., "Compositional engineering of perovskite materials for high-performance solar cells," Nature/Letter, vol. 517, Jan. 22, 2015, pp. 476-480.
Kuroiwa et al., "Heat-Set Gel-like Networks of Lipophilic Co(II) Triazole Complexes in Organic Media and Their Thermochromic Structural Transitions," Journal of American Chemical Society, vol. 126, No. 7, 2004, pp. 2016-2021.
Lau et al., "$CsPbIBr_2$ Perovskite Solar Cell by Spray-Assisted Deposition," ACS Energy Letters, vol. 1, 2016, pp. 573-577.
Li et al., "Stabilizing Perovskite Structures by Tuning Tolerance Factor: Formation of Formamidinium and Cesium Lead Iodide Solid-State Alloys," ACS Chemistry of Materials, vol. 28, 2016, pp. 284-292.

(56) References Cited

OTHER PUBLICATIONS

Mitzi et al., "Organic-Inorganic Electronics," IBM Journal of Research and Development, vol. 45, No. 1, Jan. 2001, pp. 29-45.

Nenon et al., "Structural and chemical evolution of methylammonium lead halide perovskites during thermal processing from solution," Energy & Environmental Science, vol. 9, 2016, pp. 2072-2082.

Noel et al., "A low viscosity, low boiling point, clean solvent system for the rapid crystallisation of highly specular perovskite films," Energy & Environmental Science, vol. 10, 2017, pp. 145-152.

Norton-Baker et al., "Polymer-Free Carbon Nanotube Thermoelectrics with Improved Charged Carrier Transport and Power Factor," ACS Energy Letters, vol. 1, 2016, pp. 1212-1220.

Ouyang et al., "Conducting Polymer as Transparent Electric Glue," Advanced Materials, vol. 18, 2006, pp. 2141-2144.

Pang et al., "Transformative Evolution of Organolead Triiodide Perovskite Thin Films from Strong Room-Temperature Solid-Gas Interaction between $HPbI_3$-$CH_3NH_2$ Precursor Pair," Journal of the American Chemical Society, vol. 138, 2016, pp. 750-753.

Passerini et al., "The Intercalation of Lithium in Nickel Oxide and Its Electrochromic Properties," Journal of Electrochemical Society, vol. 137, No. 10, Oct. 1990, pp. 3297-3300.

Pfeiffer et al., "Controlled doping of phthalocyanine layers by cosublimation with acceptor molecules: A systematic Seebeck and conductivity study," Applied Physics Letters, vol. 73, No. 22, Nov. 30, 1998, pp. 3202-3204.

Raw et al., "Syntheses and structure of hydrothermally prepared $CsNiX_3$ (X-$C_1$, Br, I)," Journal of Solid State Chemistry, vol. 192, 2012, pp. 34-37.

Sharma et al., "Phase Diagrams of Quasibinary Systems of the Type: $ABX_3$-$A'BX_3$; $ABX_3$-$AB'X_3$, and $ABX_3$-$ABX'_3$; X = Halogen," Zeitschrift für Physikalische Chemie, 1992, pp. 63-80.

Sun et al., "Influence of water on the electrochemical properties of $(CeO_2)_x(TiO_2)_{1-x}$ and $WO_3$ sol-gel coatings and electrochromic devices," Solid State Ionics, vol. 165, 2003, pp. 181-189.

Tanaka et al., "Bandgap and exciton binding energies in lead-iodide-based natural quantum-well crystals," Science and Technology of Advanced Materials, vol. 4, 2003, pp. 599-604.

Treml et al., "Quantitative Framework for Evaluating Semitransparent Photovoltaic Windows," ACS Energy Letters, vol. 1, 2016, pp. 391-394.

Wittwer et al., "Gasochromic windows," Solar Energy Materials and Solar Cells, vol. 84, Issues 1-4, Oct. 2004, pp. 305-314.

Yangui et al., "Rapid and robust spatiotemporal dynamics of the first-order phase transition in crystals of the organic-inorganic perovskite $(C_{12}H_{25}NH_3)2PbI_4$," Scientific Reports, 5:16634, pp. 1-10, (2015).

You et al., "Low-Temperature Solution-Processed Perovskite Solar Cells with High Efficiency and Flexibility," ACS Nano, vol. 8, No. 2, 2014, pp. 1674-1680.

Zhao et al., "Optical bleaching of perovskite $(CH_3NH_3)PbI_3$ through room-temperature phase transformation induced by ammonia," The Royal Society of Chemistry, Chemical Communication, vol. 50, 2014, pp. 1605-1607.

Zong et al., "Thin-Film Transformation of $_4PbI_3$ to $CH_3NH_3PbI_3$ Perovskite: A Methylamine-Induced Conversion-Healing Process," Angewandte Chemie International Edition, vol. 55, 2016, pp. 14723-14727.

\* cited by examiner

ENERGY-HARVESTING CHROMOGENIC DEVICES

CROSS-REFERENCE TO RELATED APPLICATIONS

This application claims the benefit of U.S. Provisional Patent Application No. 62/463,850 filed Feb. 27, 2017, the contents of which are incorporated herein by reference in their entirety.

CONTRACTUAL ORIGIN

The United States Government has rights in this invention under Contract No. DE-AC36-08GO28308 between the United States Department of Energy and Alliance for Sustainable Energy, LLC, the Manager and Operations of the National Renewable Energy Laboratory.

BACKGROUND

Buildings account for 72% of the total electricity consumption in the United States. Consumption is expected to rise to 75% by 2025. Regulating solar radiation gain through windows plays a pivotal role in decreasing building energy consumption. This is a challenging research endeavor as window energy efficiency and cost must also be balanced with the demand for large high-transmission windows for architectural aesthetics as well as occupant comfort. "Smart" glass technology uniquely addresses this challenge.

Smart windows regulate building solar radiation gain by switching from a transparent phase when sun is desired for natural lighting, heating, and/or comfort to a tinted (or reflective) phase during seasons and/or times of day when building heat gain is problematic. There are a number of chromogenic current technologies that achieve this, including suspended particle, liquid crystal, and electro-, thermo-, gaso-, photo-, and photoelectro-chromic. The operation of these technologies may be subdivided as "active" or "passive." An active device may be controllably actuated and may be programmed by the building occupant. For example, the user may push a button that applies an electrical bias that switches the phase of the device. This is a desirable feature that adds additional expense and complexity due to the need for additional electrical circuitry. Thermogenic and chromogenic layers typically operate passively where solar radiation may induce switching from transparent to tinted due to high energy light (photochromic) or due to a temperature increase in the layer (thermochromic). This results in lower energy consumption than with standard windows, without the added expense of electrical switching found in electrochromic windows but without the feature of dynamic actuation by the user. The smart glass market is relatively young and is projected to be nearly a one billion-dollar annual industry by 2022. Thus, there remains a need for improved smart glass technologies.

SUMMARY

An aspect of the present disclosure is a device that includes a perovskite, where, when a first condition is met, at least a portion of the perovskite is in a first phase that substantially transmits light, when a second condition is met, at least a portion of the perovskite is in a second phase that substantially absorbs light, and the perovskite is reversibly switchable between the first phase and the second phase by reversibly switching between the first condition and the second condition. In some embodiments of the present disclosure, the first phase may include a first crystal system that includes at least one of triclinic, monoclinic, orthorhombic, tetragonal, trigonal, hexagonal, rhombohedral, hexagonal, and/or cubic. In some embodiments of the present disclosure, the second phase may include a second crystal system that includes at least one of triclinic, monoclinic, orthorhombic, tetragonal, trigonal, hexagonal, rhombohedral, hexagonal, and/or cubic. In some embodiments of the present disclosure, the first phase may include an orthorhombic crystal system, and the second phase may include a cubic crystal system.

In some embodiments of the present disclosure, the first phase may include a first crystal system having a first symmetry, and the second phase may include a second crystal system having a second symmetry. In some embodiments of the present disclosure, the first symmetry may include at least one of P222, Pmm2, Pm-3m, Pba2, Cmca, Cmmm, Imma, pnma, Amm2,P6, P2n3, 1432, P 4/m 3 2/m, and/or F 2/d 3. In some embodiments of the present disclosure, the second symmetry may include at least one of P222, Pmm2, Pm-3m, Pba2, Cmca, Cmmm, Imma, pnma, Amm2, P6, P2n3, 1432, P 4/m 3 2/m, and/or F 2/d 3.

In some embodiments of the present disclosure, the first crystal system and the second crystal system may be both substantially orthorhombic, the first symmetry may be Amm2, and the second symmetry may be Pmnb. In some embodiments of the present disclosure, the first crystal system may be orthorhombic, the second crystal system may be cubic, the first symmetry may be Pmnb, and the second symmetry may be Pm-3m. In some embodiments of the present disclosure, the first crystal system may be orthorhombic, the second crystal system may be cubic, the first symmetry may be pnma, and the second symmetry may be P2n3. In some embodiments of the present disclosure, the first crystal system may be hexagonal, the second crystal system may include at least one of tetragonal and/or trigonal, the first symmetry may be P6, and the second symmetry may include at least one of 1432, P 4/m 3 2/m, and/or F 2/d 3.

In some embodiments of the present disclosure, when the second condition is met, at least a portion of the light absorbed by the perovskite may be converted to a current. In some embodiments of the present disclosure, when the first condition is met, a portion of light may be absorbed by the perovskite and converted to a current. In some embodiments of the present disclosure, the perovskite may include at least one of $ABX_3$, $ABX_4$, $A_2BX_6$, and/or $A'_2A''_{n-1}B_nX_{3n+1}$, where A, A', and A" may include a first cation, where A' is different than A", where B may include a second cation that is different from A, A', and A", and X includes an anion. In some embodiments of the present disclosure, the perovskite may include $ABX_3$, wherein the first cation may include cesium, the second cation may include lead, and the anion may include at least one of iodine and/or bromine. In some embodiments of the present disclosure, the perovskite may include $CsPbI_2Br$. In some embodiments of the present disclosure, the first condition may be achieved when the perovskite attains a first temperature below 200° C. In some embodiments of the present disclosure, the second condition may be achieved when the perovskite attains a second temperature above 15° C.

An aspect of the present disclosure is a method that includes reversibly switching a perovskite between a first phase and a second phase by manipulating a condition of the perovskite where, when in the phase, the perovskite is substantially transparent to light in the visible spectrum, and when in the second phase, the perovskite absorbs at least a portion of light in the visible spectrum. In some embodiments of the present disclosure, the switching may be achieved by at least one of changing a temperature of the perovskite, applying a voltage to the perovskite, changing a pressure of the perovskite, exposing a surface of the perovskite to a molecule, and/or removing the molecule from the surface.

DRAWINGS

Exemplary embodiments are illustrated in the referenced figures of the drawings. It is intended that the embodiments and figures disclosed herein are to be considered illustrative rather than limiting.

Figure 3:
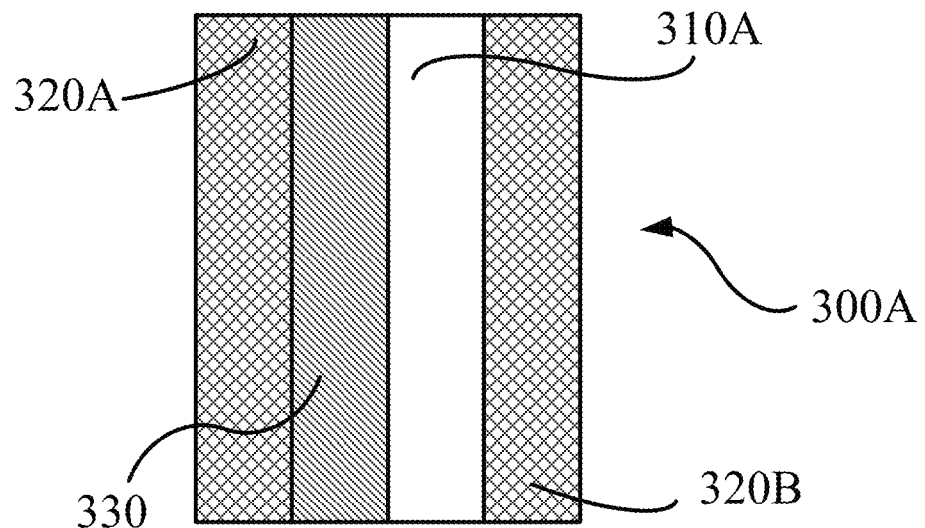
Figure 3:
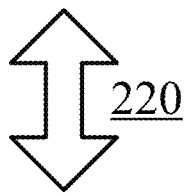
Figure 3:
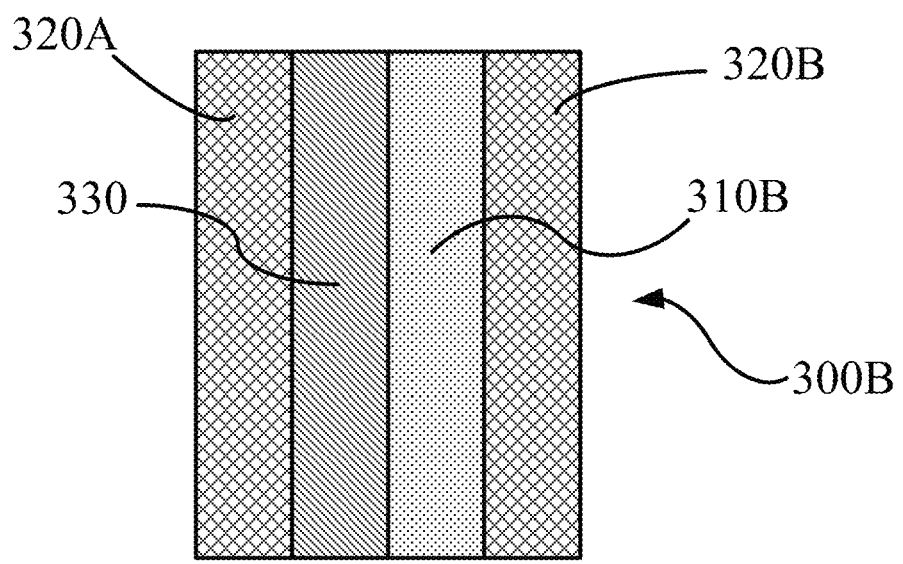

FIG. 3 illustrates a device, for example a thermochromic window that includes a switchable perovskite layer that is reversibly switchable between a first phase that is substantially transparent, at least in the visible range of the light spectrum, and a second phase that is substantially absorbing, at least in the visible range of the light spectrum, according to some embodiments of the present disclosure.

Figure 4:
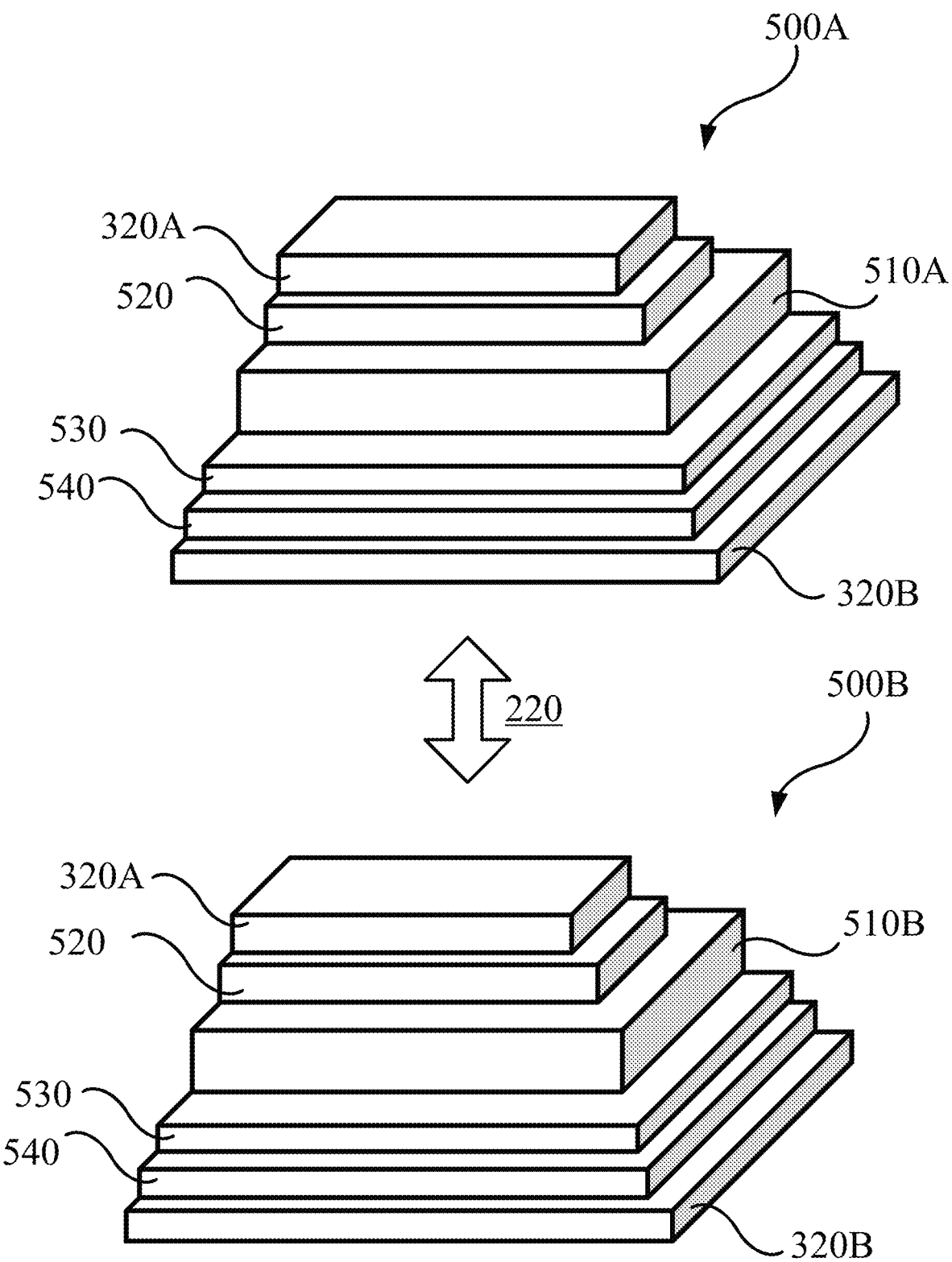

FIG. 4 illustrates a schematic diagram of photovoltaic device design based on a switchable $CsPbI_2Br$ perovskite, according to some embodiments of the present disclosure.

Figure 5:
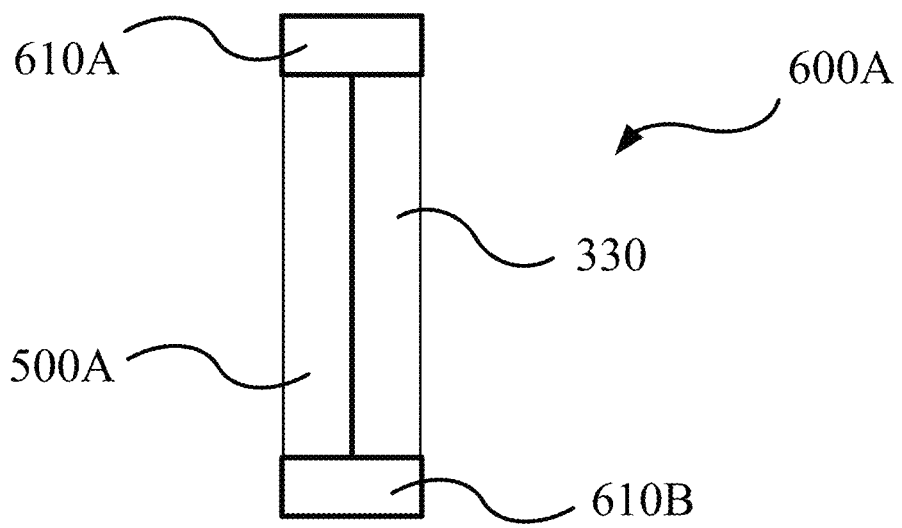
Figure 5:
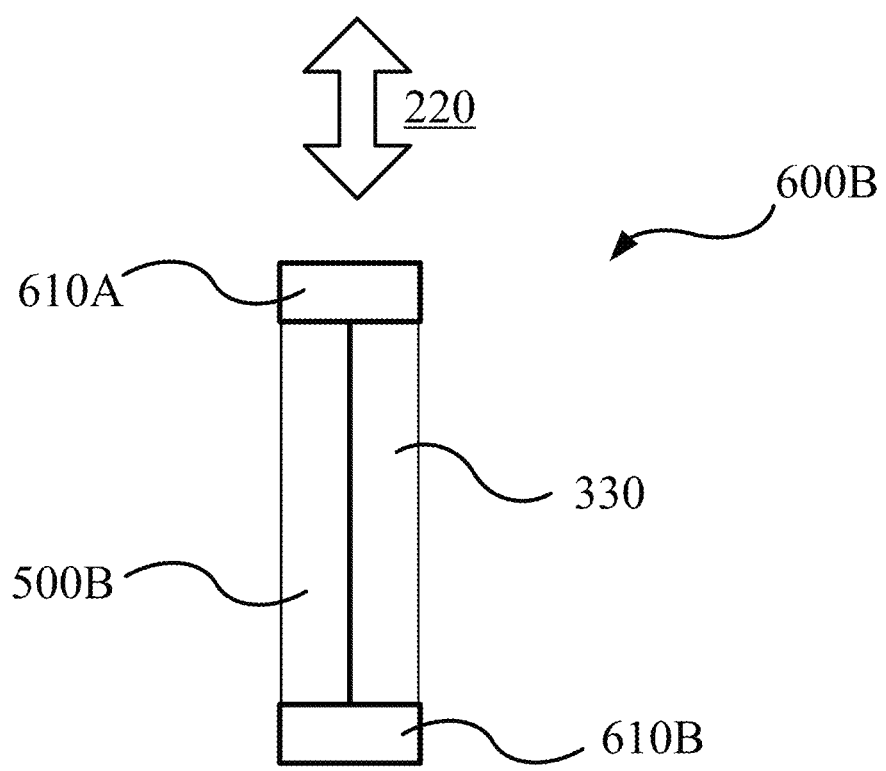

FIG. 5 illustrates a switchable thermochromic device based on switchable perovskite material, according to some embodiments of the present disclosure.

Figure 6:
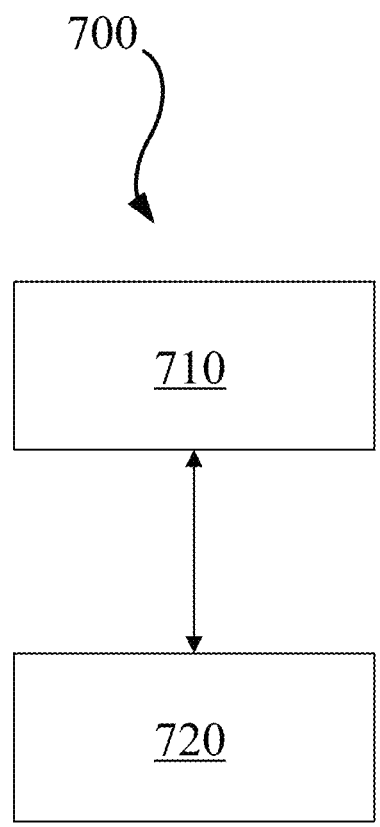

FIG. 6 illustrates a method for reversibly switching a switchable perovskite layer and/or device between a first transparent phase to a second opaque phase, according to some embodiments of the present disclosure.

Figure 7:
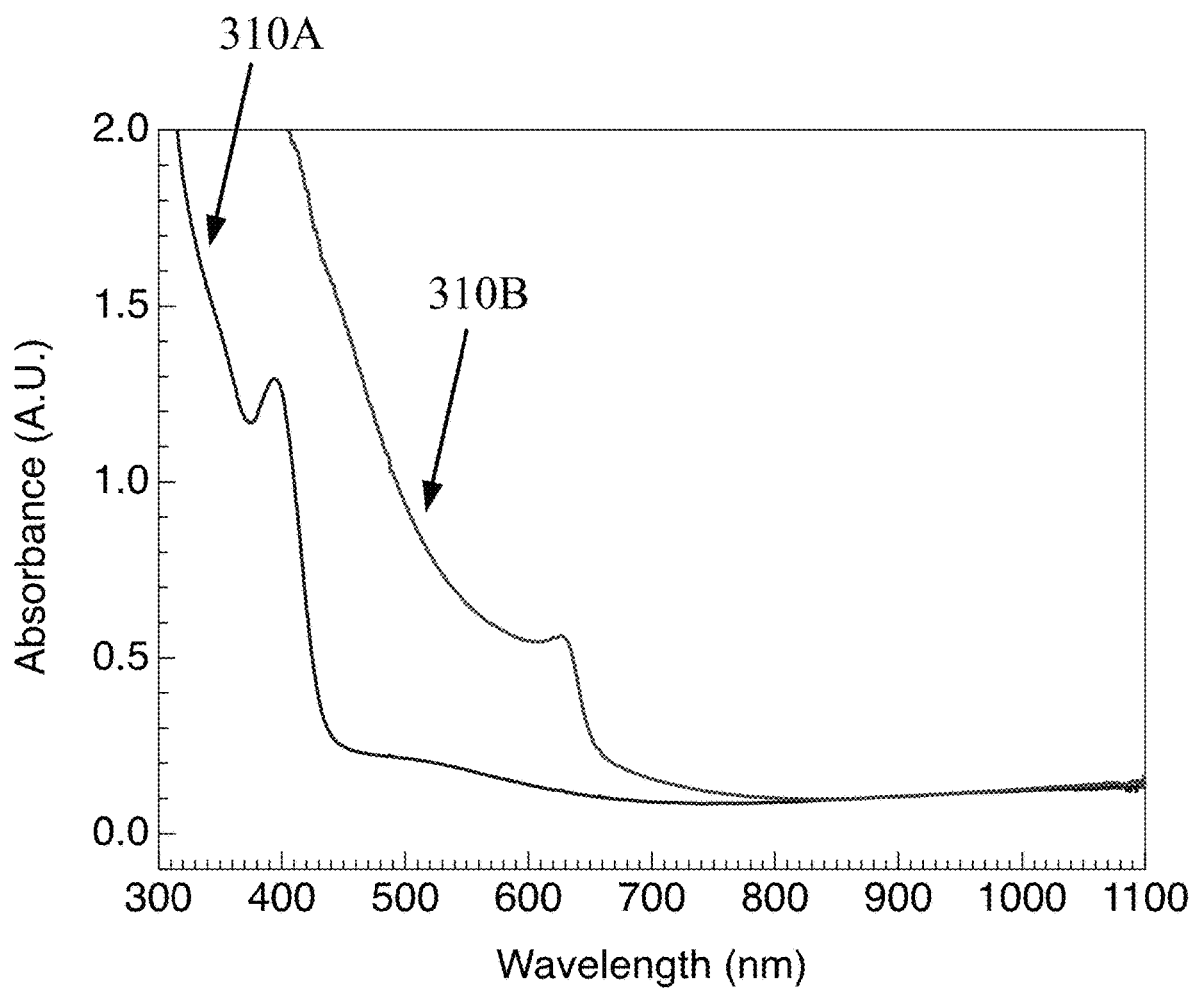

FIG. 7 illustrates absorption spectra of $CsPbI_2Br$ thin films deposited on fluorine-doped tin oxide (FTO), according to some embodiments of the present disclosure.

Figure 8:
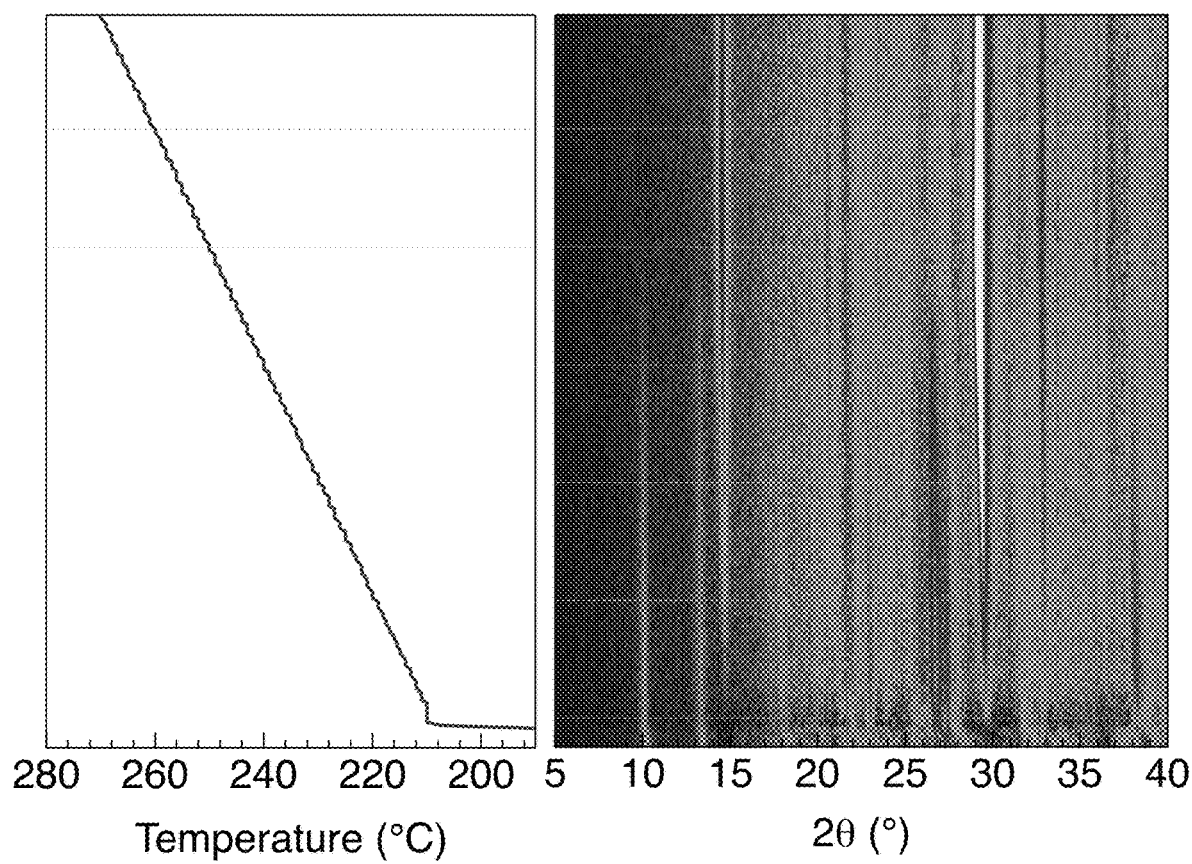

FIG. 8 illustrates temperature-dependent X-ray diffraction results from tests performed on the film described in FIG. 7, according to some embodiments of the present disclosure.

Figure 9:
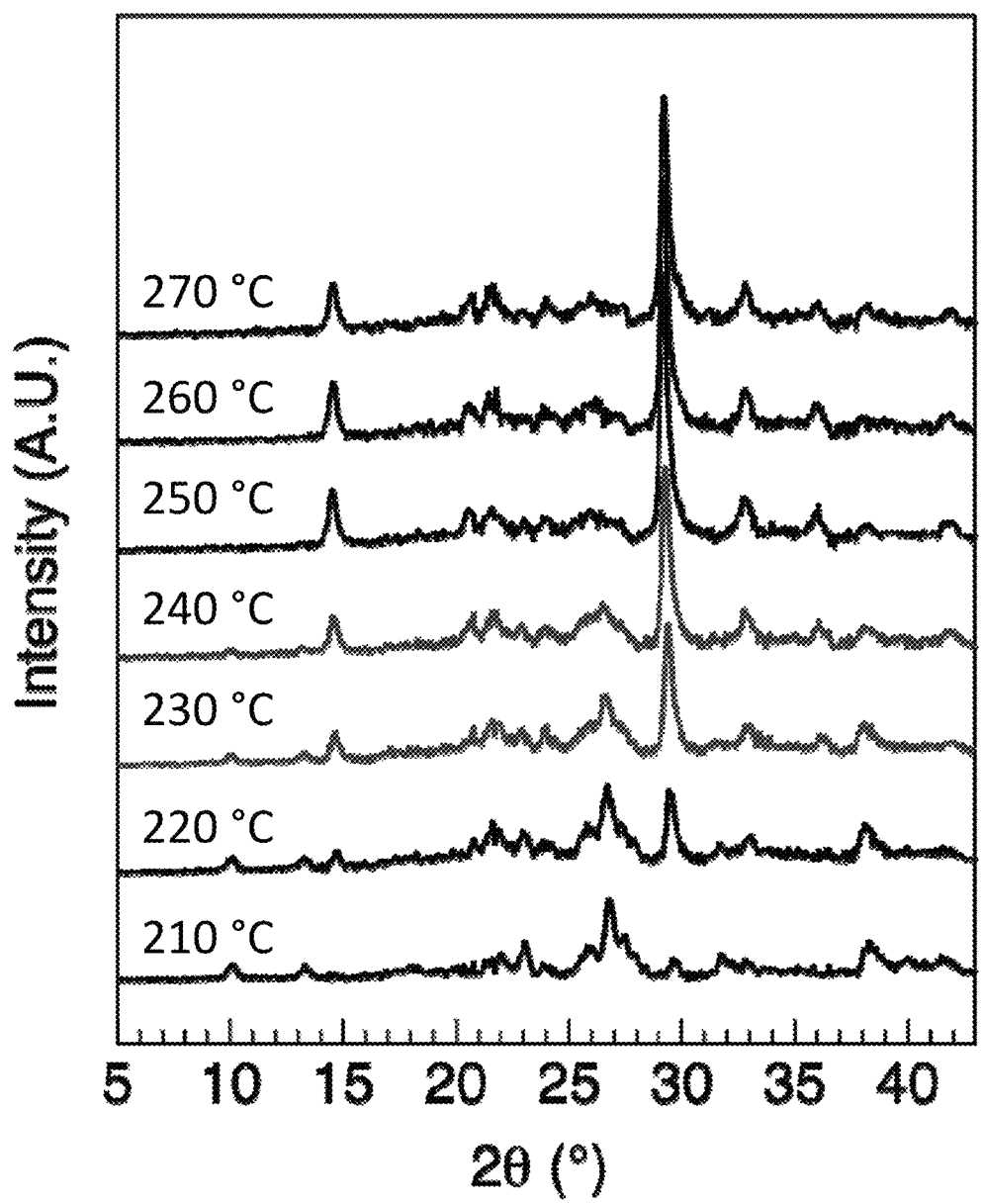

FIG. 9 illustrates temperature-dependent X-ray diffraction patterns extracted from the data shown in FIG. 8, according to some embodiments of the present disclosure.

Figure 10:
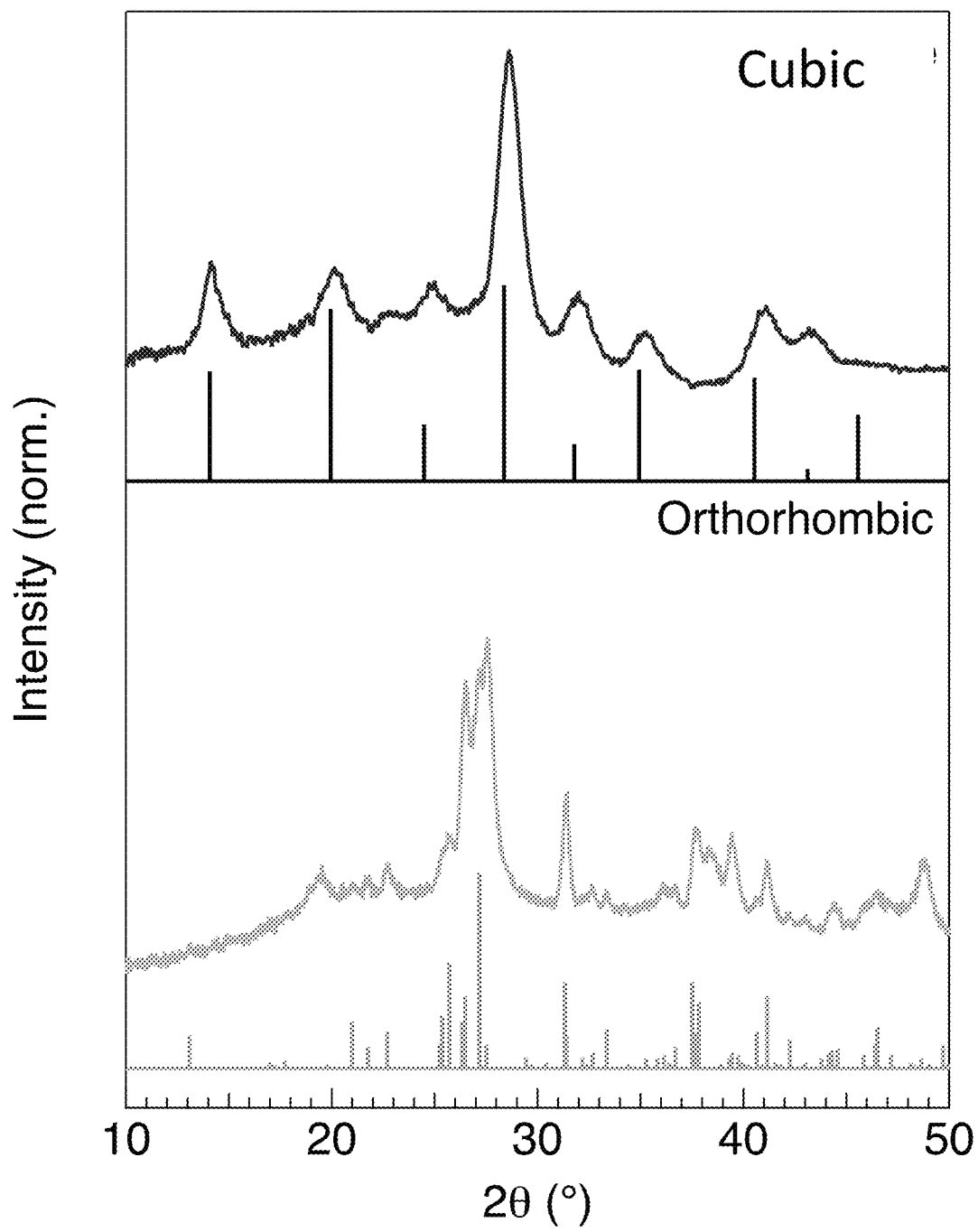

FIG. 10 illustrates theoretically-calculated X-ray diffraction patterns for a cubic perovskite absorbing crystal system and an orthorhombic perovskite transparent crystal system, where the vertical lines are theoretical, and the curves are data from FIG. 9.

Figure 11:
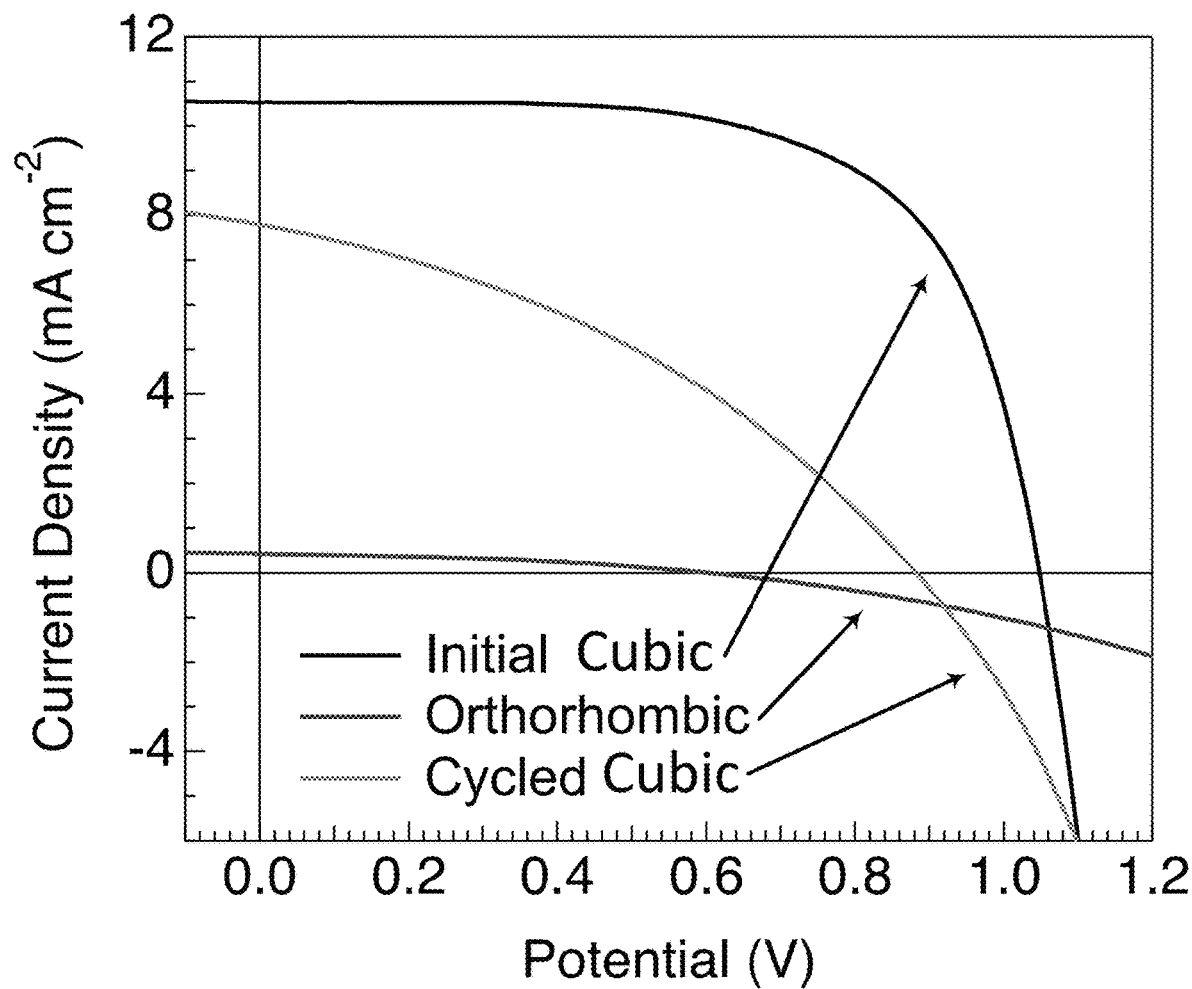

FIG. 11 illustrates current density-voltages curves of a photovoltaic device fabricated with a $CsPbI_2Br$ active layer, according to some embodiments of the present disclosure.

Figure 12:
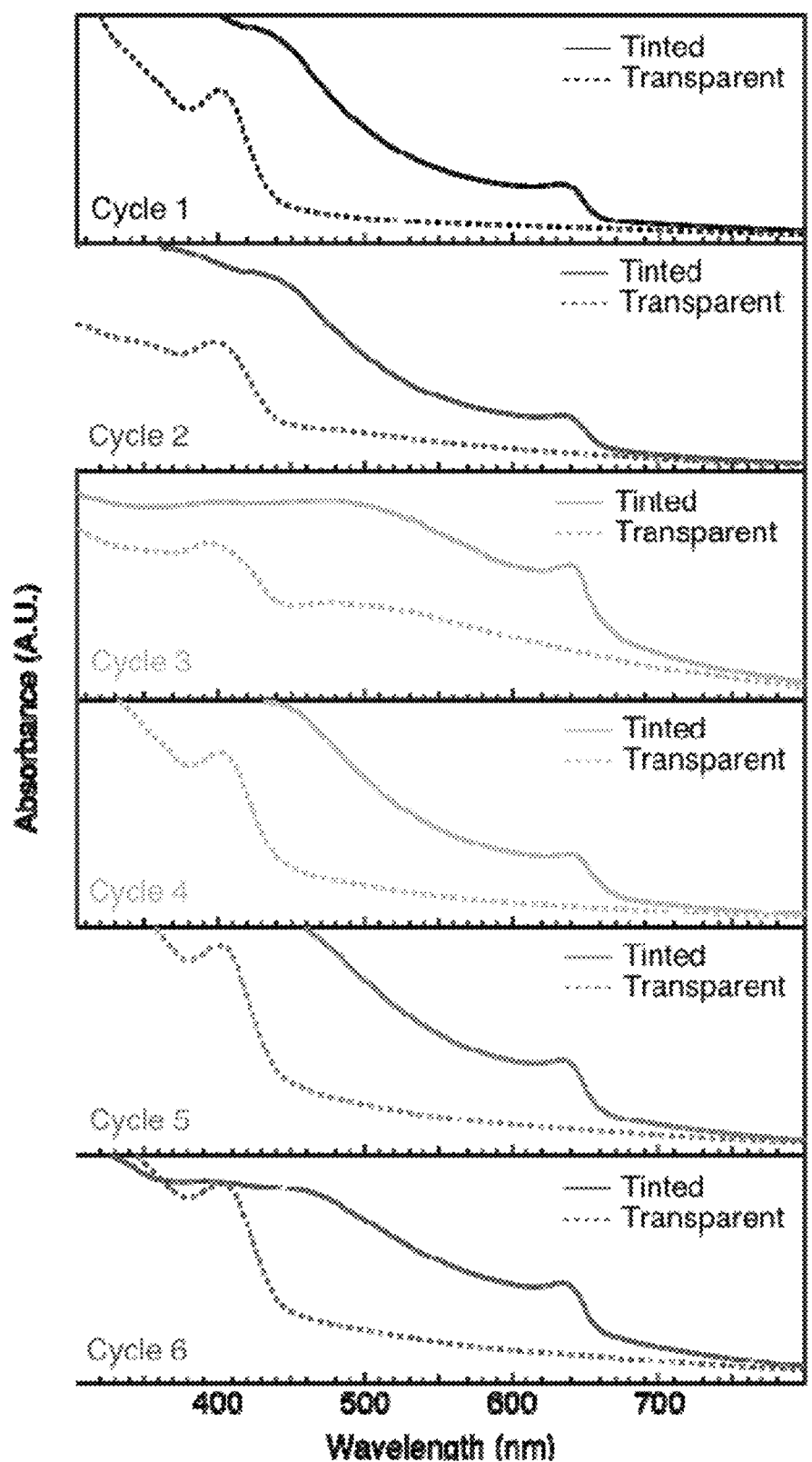

FIG. 12 illustrates absorption properties of perovskite layers composed of $CsPbI_2Br$ deposited on glass, according to some embodiments of the present disclosure.

Figure 13:
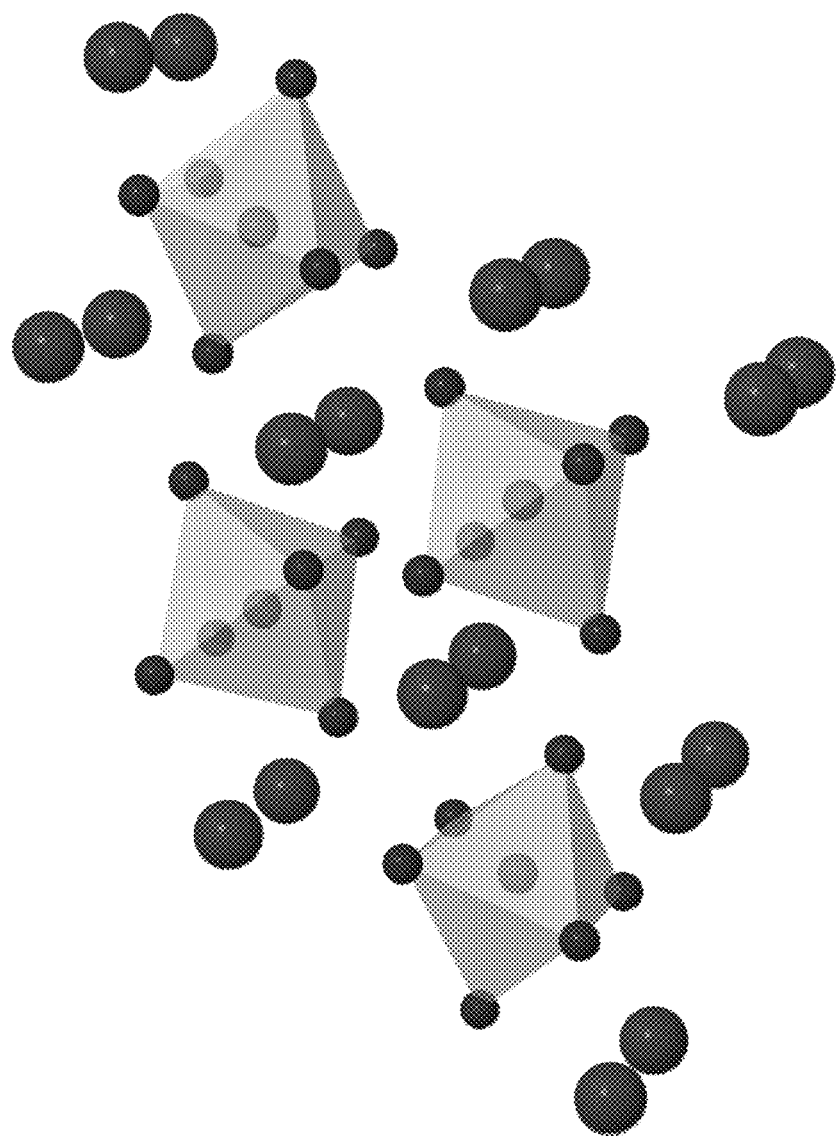

FIG. 13 illustrates an example of a crystal system, a transparent orthorhombic crystal system, according to some embodiments of the present disclosure.

REFERENCE NUMBERS

100 . . . perovskite
110 . . . cation (A)
120 . . . cation (B)
130 . . . anion (X)
210 . . . perovskite material
210A . . . perovskite material in first phase
210B . . . perovskite material in second phase
220 . . . switching mechanism
300 . . . photovoltaic device
310 . . . perovskite layer
310A . . . perovskite layer in first phase
310B . . . perovskite layer in second phase
320 . . . substrate layer
330 . . . intervening layer
500 . . . photovoltaic device
510 . . . perovskite layer
510A . . . perovskite layer in first phase
510B . . . perovskite layer in second phase
520 . . . hole transport layer
530 . . . electron transport layer
540 . . . transparent conducting layer
600 . . . thermochromic device
600A . . . thermochromic device in a first phase
600B . . . thermochromic device in a second phase
610 . . . encapsulant
700 . . . method
710 . . . applying a first condition
720 . . . applying a second condition

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

The present disclosure relates to photovoltaic devices having thermochromic absorption/transmission properties. The absorption properties of a material, layer, and/or particle in such a photovoltaic device may be switched from visibly absorbing to visibly transparent by changing the phase (e.g. crystal system and/or symmetry) of the material, layer, and/or particle. In some embodiments of the present disclosure, when the material, layer, and/or particle is at a first condition, for example a first temperature, the material, layer, and/or particle may achieve a visibly transparent first phase. However, when the material, layer, and/or particle is switched to a second condition, for example by heating and/or cooling to a second temperature, the material, layer, and/or particle may convert to a second phase, which may absorb at least a part of the visible portion of the solar spectrum. In some embodiments of the present disclosure, the switchable material, layer, and/or particle of the device may be photovoltaically active in both phases (the visibly absorbing phase and the visibly transparent phase). This may provide significant advancements towards the economical production of glazing devices that dynamically modulate absorption/transmission properties while also converting sunlight to usable electricity.

In some embodiments of the present disclosure, effective switchable (e.g. from visibly transparent to visibly absorbing) photovoltaic devices are described having a switchable material, layer, and/or particle constructed of a perovskite such that the perovskite may be reversibly switched between a first phase (e.g. crystal system and/or symmetry) that is transparent to the visible spectrum and a second phase that absorbs at least a part of the visible spectrum. For example, a cesium lead bromide iodide (CsPbI$_2$Br) film may be produced from solution. Subsequently, the film may be crystallized at about 250° C. to yield a switchable perovskite layer in a cubic crystal system that is brown in appearance (e.g., visibly absorbing). In some embodiments of the present disclosure, cooling a perovskite layer results in the reversible switching of the perovskite layer from a visibly absorbing cubic crystal system (generally referred to herein as a "second phase") to a visibly transparent orthorhombic crystal system (generally referred to herein as a "first phase"). A photovoltaic device was fabricated by depositing a CsPbI$_2$Br layer on a glass layer coated with fluorine-doped tin oxide and titanium oxide. The device further included a polymer hole-transport layer and gold contacts, with the final device yielding power conversion efficiencies of 7%.

When allowed to cool in air, the CsPbI$_2$Br layer converted to an orthorhombic crystal system, a visibly transparent first phase. The device was still photovoltaic in the transparent orthorhombic phase and converted the ultraviolet portion of the solar spectrum to electricity with an overall efficiency of 0.1% The CsPbI$_2$Br layer was switched back to the cubic crystal system, a visibly-absorbing (brown) second phase, by heating the CsPbI$_2$Br layer to about 240° C. The device, with the CsPbI$_2$Br layer returned to the cubic crystal system, provided a device efficiency of about 2.5%.

Thus, the present disclosure describes, among other things, the design of devices employing switchable materials that may switch from transparent first phases to tinted (opaque, reflective) second phases due to a reversible phase transitions in photovoltaic materials, layers, and/or particles. Thus, in some embodiments of the present disclosure, switchable devices, for example windows, are described that may switch phases (e.g. reversibly between substantially transparent to substantially opaque) and also harness solar radiation to provide electricity to a structure (e.g. building or vehicle) or system (e.g. power grid). Switching of the material between its two phases may be induced by an energy input into the device containing the switchable material such as solar radiation and/or any other suitable energy source and/or heat source. Other switching mechanisms may include introducing an electrical bias. In some embodiments of the present disclosure, the first phase of a switchable material may be transparent to radiation of at a least portion of the visible solar spectrum, and while in the second phase the switchable material may absorb radiation of at least a portion of the visible solar spectrum.

Figure 1:
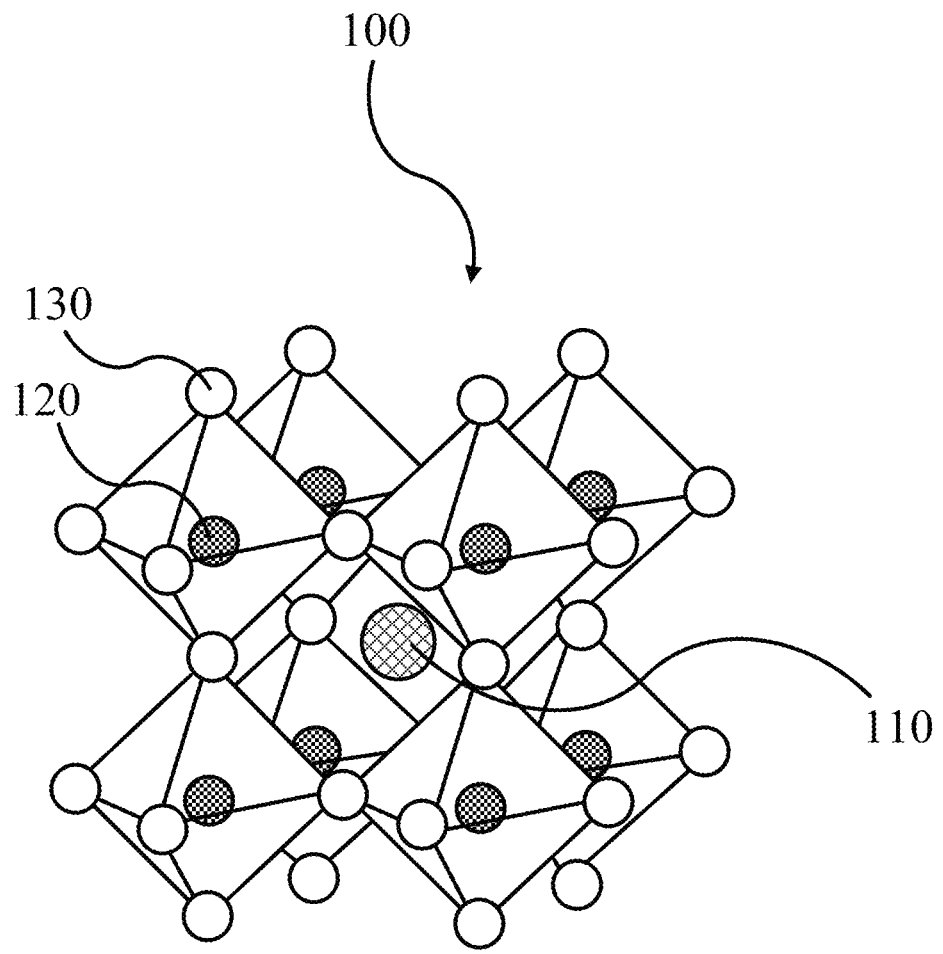
FIG. 1 illustrates an example of a perovskite, which may be used as a switchable material in a thermochromic layer and/or device, according to some embodiments of the present disclosure.

In some embodiments of the present disclosure, the switchable material, layer and/or particle may be constructed of a perovskite. FIG. 1 illustrates an example of a perovskite 100, according to some embodiments of the present disclosure. A perovskite 100 may organize into cubic crystalline structures, as well as other crystalline structures such as tetragonal, hexagonal, and orthorhombic, and may be described by the general formula ABX$_3$, where X is an anion (130) and A and B are cations (110 and 120 respectively), typically of different sizes (A typically larger than B). In a cubic unit cell, the B-cation 120 resides at the eight corners of a cube, while the A-cation 110 is located at the center of the cube and with 12 X-anions 130 centrally located between B-cations 120 along each edge of the unit cell. As used herein, the term "phase" refers to a solid that has an atomic structure with long-range, 3-dimensional order. The atomic structure of a phase is defined by a unit cell, a regularly repeating block of atoms. For convenience, crystallographers use (and as used herein) a reduced unit cell using the Hermann-Mauguin nomenclature to define the reduced unit cell of solids. The reduced unit cell may be defined by space group symmetry (there are 230 unique symmetries) and the lattice constants (lengths of the edges of the unit cell and the angle between the edges). Space group symmetries may be grouped into different crystal systems and/or subsystems (for example, triclinic, monoclinic, orthorhombic, tetragonal, trigonal, hexagonal, rhombohedral, hexagonal, and cubic). One of the 230 unique symmetries within each crystal system may further define the structure of a switchable perovskite 100. The space group may be defined by a set of symbols. The first symbol describes the centering of the Bravais lattice (P, A, B, C, I, R or F). The next three describe the most prominent symmetry operation visible when projected along one of the high symmetry directions of the crystal system. Example space groups symmetries are Pmnb, P222, Pmm2, Pba2, Cmca, Cmmm. For example, a first phase may correspond to a switchable perovskite material in a substantially orthorhombic crystal system having a Pmnb symmetry. However, the phases of a switchable perovskite may include other symmetries, such as at least one of Pmna, P222, Pmm2, Pba2, Cmca, Cmmm, and/or Imma symmetries. The phases of a perovskite material may also belong to different crystal systems, such as hexagonal with P6 symmetry. In still further embodiments, the phases of a switchable perovskite may have P62c symmetry and/or P6 mm symmetry. The second phase may belong to the same crystal system or a different crystal system as the first phase, with different or the same symmetry. For instance, a switchable perovskite material in the second phase may be cubic crystal system having a P2n3 symmetry. This phase may also have alternative symmetries, such as P2n3, 1432, P 4/m 3 2/m, or F 2/d 3, for example. The second phase of a switchable perovskite may also correspond to a different crystal system such as tetragonal or trigonal crystal systems with various symmetries.

Examples of A-cations 110 include, for example, organic cations and/or inorganic cations. Depending on the number of organic groups, the cation may be a primary (1), secondary (2), tertiary (3), or quaternary (4) ammonium. The groups may be alkyl groups. For example, a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations 110 include methylammonium (CH$_3$NH$_3^+$), ethylammonium (CH$_3$CH$_2$NH$_3^+$), propylammonium (CH$_3$(CH$_2$)$_2$NH$_3^+$), butylammonium (CH$_3$(CH$_2$)$_2$NH$_3^+$), and/or any other suitable nitrogen-containing organic compound. In other examples, an A-cation 110 may include an alkylamine. Thus, an A-cation 110 may include an organic component with an amidinium group. For example, an A-cation 110 may be formamidinium (NH$_2$CH=NH$_3^+$), or acetamidinium ((NH$_2$C(CH$_3$)=NH$_3^+$), In some cases, the organic constituent may be an alkyl group such as straight-chain, or branched, hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), isopropyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl ($C_8$) and the like. The organic constituent may also be an aryl group. Aryl groups may include phenyl, naphthyl, benzyl, and the alkylated derivatives. For example, a xylyl group. The A-anion 130 may include halogenated counterparts to the hydrocarbon groups named above. For example fluoromethyl, chloromethyl, bromomethyl, iodomethyl, fluorobenzyl, chlorobenzyl, bromobenzyl, and iodobenzyl groups. The A-cation 110 may be a metal. In some cases, the metal is an alkali metal. Examples include cesium, rubidium, potassium, and sodium. The metal halide perovskite, like other perovskites, can form three-dimensional (3-D), two-dimensional (2-D), one-dimensional (1-D) or zero-dimensional (0-D) networks, possessing the same unit structure.

Examples of metal B-cations 120 include, for example, lead, tin, germanium, transition metals such as nickel, copper, or zinc, and/or any other 2+ valence state metal that can charge-balance the perovskite 100. The metal B-cations 120 could also include a mixture of metals with different valance states such that the overall perovskite 100 is charge balanced. For example, a mixture of 1+ and 3+ valence state metal cations. Examples of an X-anion 130 include halides: e.g. fluorine, chloride, bromide, and/or iodide and/or a non-halide such as $SCN^-$. In some cases, the organic-inorganic metal halide perovskite may include more than one X-anion 130, for example pairs of halides; chlorine and iodine, bromine and iodine, and/or any other suitable pairing of halides. In other cases, a perovskite 100 may include two or more halides of fluorine, chlorine, bromine, and/or iodine. Thus, the A-cation 110, B-cation 120, and X-anion 130 may be selected within the general formula of $ABX_3$ to produce a wide variety of perovskites 100, for example, in the form of particles, layers, sheets, and/or any other suitable shape depending on the application. Thus, a perovskite 100 may have more than one halogen element, where the various halogen elements are present in non-integer quantities; e.g. x is not equal to 1, 2, or 3. Examples of metal halide compounds include, but are not limited to: $CsPbI_2Br$, $CsPbIBr_2$, $CsPbI_3$, $CsSnI_3$, $CsPbI_2Br$, $(CH_3NH_3)_{1-a}Cs_aPbI_{3-x}Cl_x$, $(CH_3NH_3)_{1-a}Cs_aPbI_{3-x}Cl_x$, $(NH_2CHNH_3)_{1-a}Cs_aPbI_3$, $(NH_2CHNH_3)_{1-a}Cs_aPb_mSn_{1-m}I_3$, $(NH_2CHNH_3)_{1-a}Cs_aPb_{1-m-n}Sn_mBi_nI_{3-x}Cl_x$, $(NH_2CHNH_3)_{1-a}Cs_aPb_{1-m-n}Sn_mI_{3-x}Clx$, $(NH_2CHNH_3)_{1-a}Cs_aPb_{1-m-n}Sn_mBi_nI_{3-x}V_x$, $(NH_2CHNH_3)_{1-a}Cs_aPb_{1-m-n}Sn_mBi_nI_{3-x}V_x$, and $(NH_2CHNH_3)_{1-a-b}Cs_a(CH_3NH_3)_bPb_{1-m-n}Sn_mBi_nI_{3-x-y}Br_xV_y$ where V is a vacancy and $0 \le a,b,m,n \le 1$ and $0 \le x,y \le 1$.

Figure 2:
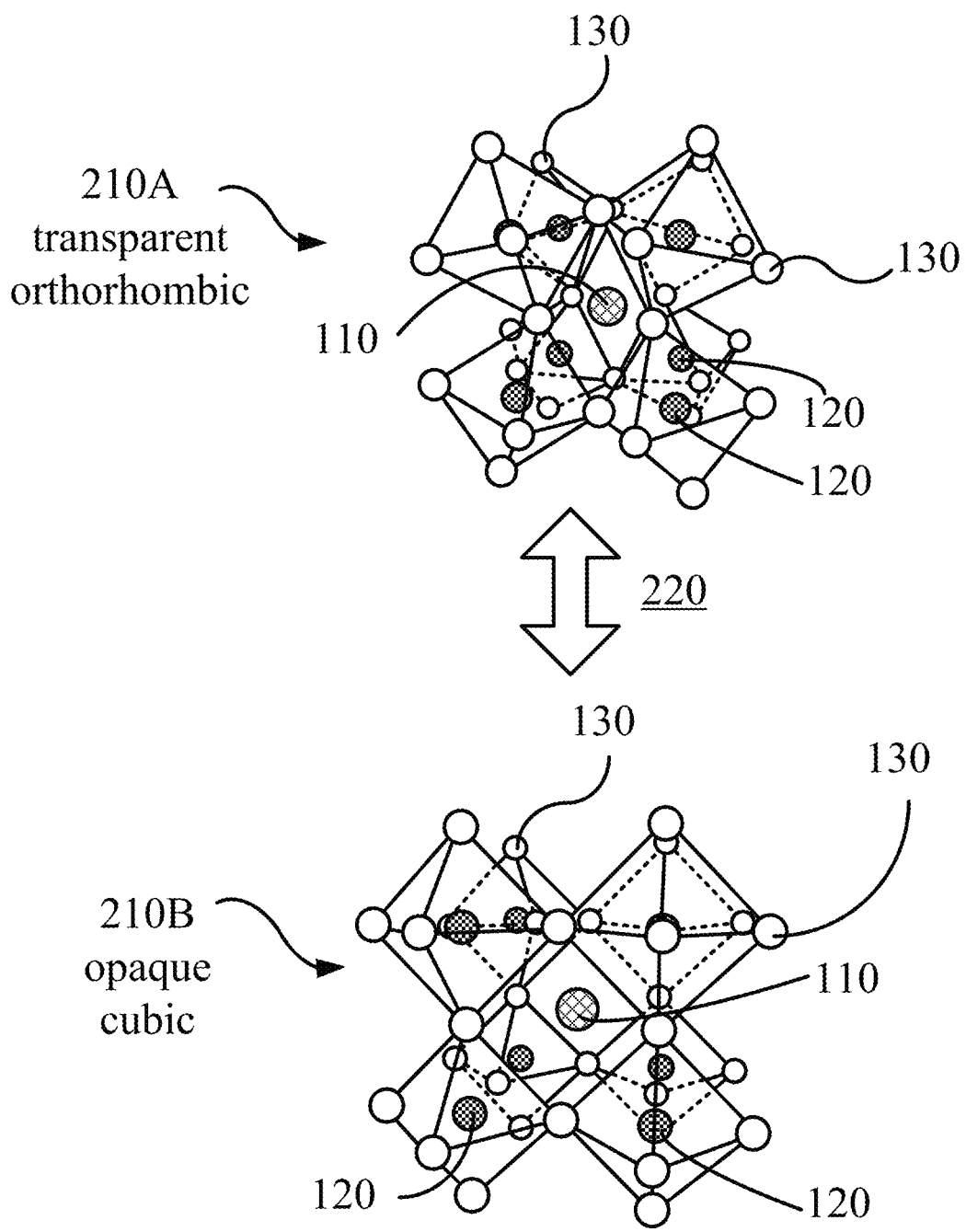
FIG. 2 illustrates a switchable perovskite that is reversibly switchable between a first phase that is substantially transparent, at least in the visible range of the light spectrum, and a second phase that is substantially absorbing, at least in the visible range of the light spectrum, according to some embodiments of the present disclosure.

FIG. 2 illustrates a perovskite material 210 that is reversibly switchable between a first substantially transparent phase 210A and a second substantially opaque phase 210B (identical to the perovskite 100 illustrated in FIG. 1) by a switching mechanism 220. In some embodiments of the present disclosure, the perovskite material 210 may include a metal halide perovskite, with examples including $CsPbI_2Br$, $CsPbIBr_2$, $CsPbI_3$, $CsSnI_3$, $CsPbI_2Br$, $(CH_3NH_3)_{1-a}Cs_aPbI_{3-x}Cl_x$, $(CH_3NH_3)_{1-a}Cs_aPbI_{3-x}Cl_x$, $(NH_2CHNH_3)_{1-a}Cs_aPbI_3$, $(NH_2CHNH_3)_{1-a}Cs_aPb_mSn_{1-m}I_3$, $(NH_2CHNH_3)_{1-a}Cs_aPb_{1-m-n}Sn_mBi_nI_{3-x}Cl_x$, $(NH_2CHNH_3)_{1-a}Cs_aPb_mSn_{1-m}I_{3-x}Clx$, $(NH_2CHNH_3)_{1-a}Cs_aPb_{1-m-n}Sn_mBi_nI_{3-x}V_x$, $(NH_2CHNH_3)_{1-a}Cs_aPb_{1-m-n}Sn_mBi_nI_{3-x}V_x$, and $(NH_2CHNH_3)_{1-a-b}CS_a(CH_3NH_3)_bPb_{1-m-n}Sn_mBi_nI_{3-x-y}Br_xV_y$ where V is a vacancy and $0 \le a,b,m,n \le 1$ and $0 \le x,y \le 1$. In some embodiments of the present disclosure, the first phase 210A (transparent) may correspond to a perovskite material having a substantially orthorhombic system with pnma symmetry (see FIG. 13 for a more detailed illustration of the transparent orthorhombic system example). The first phase 210A (transparent) may also be of a different symmetry, such as P222, Pmm2, Pba2, Cmca, Cmmm, or Imma, for example. The first phase 210A (transparent) may also be a different crystal system such as a hexagonal crystal system with P6 symmetry. Examples of P6 symmetry include P62c and P6mm. In some embodiments of the present disclosure, the second substantially opaque phase 210B may corresponds to a perovskite material having a substantially cubic crystal system with P2n3 symmetry. The second phase 210B (opaque) may also have alternative symmetries, such as 1432, P 4/m 3 2/m, or F 2/d 3, for example. The second phase 210B (opaque) may also correspond to a different crystal system such as tetragonal or trigonal crystal systems with various symmetries. In some embodiments of the present disclosure, the first phase 210A of the switchable perovskite material may be characterized as being significantly transparent, whereas the second phase 210B of the switchable perovskite material may be characterized as being significantly tinted, opaque, and/or reflective. The first phase 210A of the switchable perovskite material may be characterized by the perovskite material being substantially transparent to light, for example, to light in the visible spectrum which spans the wavelength range approximately from 390 nm (blue light) to 700 nm (red light) for the human eye. The second phase 210B of the switchable perovskite material may be characterized by the perovskite material being substantially tinted, opaque, absorptive to light in the visible spectrum, and/or reflective to light in the visible spectrum where the visible spectrum is between 390 (blue) nm to 700 nm (red) for the human eye. In some embodiments of the present disclosure, the switchable perovskite material (210A and 210B) may be reversibly switched between opaque and transparent in any desired spectrum of light, as required by the specific application. For example, the switchable perovskite material (210A and 210B) may be reversibly absorbing and transparent in at least one of the ultraviolet, near infrared, mid infrared, and/or far infrared regions of the electromagnetic spectrum. It should also be understood that when in the transparent first phase 210A, the switchable perovskite material may approach 100% transmission of a portion of the electromagnetic spectrum, such as the visible spectrum, which spans approximately from 390 (blue) nm to 700 nm (red) for the human eye. It may also span the infrared spectrum, which encompasses wavelengths of 700 nm or longer or the ultraviolet region, which includes wavelengths of 390 nm or shorter. However, in some embodiments of the present disclosure, when in the transparent first phase 210A, the perovskite material may transmit less than 100% of a portion of the electromagnetic spectrum such as the visible spectrum, which spans approximately from 390 (blue) nm to 700 nm (red) for the human eye. It may also span the infrared spectrum, which encompasses wavelengths of 700 nm or longer or the ultraviolet region, which includes wavelengths of 390 nm or shorter. Similarly, in some embodiments of the present disclosure, when in the absorbing second phase 210B, the perovskite material may approach 100% absorption of a portion of the electromagnetic spectrum such as the visible spectrum, which spans approximately from 390 (blue) nm to 700 nm (red) for the human eye. It may also span the infrared spectrum, which encompasses wavelengths of 700 nm or longer or the ultraviolet region, which includes wavelengths of 390 nm or shorter. However, in some embodiments of the present disclosure, when in the absorbing second phase 210B, the perovskite material may absorb less than 100% of a portion of the electromagnetic spectrum such as the visible spectrum, which spans approximately from 390 (blue) nm to 700 nm (red) for the human eye. It may also span the infrared spectrum, which encompasses wavelengths of 700 nm or longer or the ultraviolet region, which includes wavelengths of 390 nm or shorter.

Referring again to FIG. 2, a switching mechanism 220 may reversibly change the phase of the switchable perovskite material from the first (transparent) phase 210A to the second (absorbing) phase 210B, for example, by exposing the switchable perovskite material to, and/or shielding the switchable material from, a gradient. In some cases, the switching mechanism 220 may include at least one of a changeable pressure gradient, a temperature gradient, a magnetic field gradient, and/or a voltage gradient. For instance, when the temperature of the switchable perovskite materials is raised from 20° C. to 40° C., the material switches from the first transparent phase 210A to the second opaque phase 210B. In some embodiments of the present disclosure, changing the voltage across the switchable materials from 1V to 5V, may cause the perovskite material to change from the first transparent phase 210A to the second opaque phase 210B. In some embodiments of the present disclosure, the pressure of gas adjacent to the switchable perovskite materials may be increased from 500 torr to 760 torr (absolute pressures), which may result in the perovskite material changing from the first phase 210A (substantially transparent) to the second phase 210B (substantially opaque). In some embodiments of the present disclosure, the switching mechanism 220 may be a passive mechanism, for example, an ambient condition such as temperature, and/or pressure. Thus, when a predefined ambient condition is met, the perovskite material may switch from the first phase 210A to the second phase 210B and vice versa. For example, the switching mechanism 220 may be defined by a target condition or state obtained by the perovskite material; when the switchable material is at or below the target condition, the switchable perovskite material may be in the first (transparent) phase 210A, and when the switchable perovskite material is above the target condition, the switchable perovskite material may be in the second (absorbing) phase 210B. In some embodiments of the present disclosure, the switchable perovskite material may be in the first phase 210A when the switchable material is at or above a target condition and in the second phase 210B when the switchable material is below the target condition. For example, the perovskite material (210A and 210B) may have a switching mechanism 220 that is a transition from a first condition to a second condition, from a first range of conditions to a second range of conditions, and/or the transition of a condition through some target condition.

Referring again to FIG. 2, the switching mechanism 220 may be the transition of a temperature, a pressure, and/or a voltage of the perovskite material (210A and 210B) from a first condition to a second condition, from a first range of conditions to a second range of conditions, and/or a transition through some target condition. In some embodiments of the present disclosure, the switching mechanism 220 may be a transition of a bulk temperature and/or local temperature of the perovskite material (210A and 210B) through a target temperature between about 30° C. and about 65° C. In some embodiments of the present disclosure, the switching mechanism 220 may be a transition of a pressure of the perovskite material (210A and 210B) through a target pressure between about $10^{-3}$ torr and about 760 torr (absolute pressures). In some embodiments of the present disclosure, the switching mechanism 220 may be a transition of a voltage applied to a switchable perovskite material (210A and 210B) through a target voltage between −20 V and 20 V. Thus, the switching mechanism 220 may be passively activated by the natural changes occurring to the environment in which the switchable perovskite material (210A and 210B) is located, such that the switching mechanism 220 may be a passive change and/or transition of some condition of the perovskite material (210A and 210B). In some embodiments of the present disclosure, the switching mechanism 220 may be actively triggered by a user inducing changes to the environment in which the switchable perovskite material (210A and 210B) is located and/or to the perovskite material (210A and 210B) itself. For example, a user may turn on a device that applies heat to the perovskite material (210A and 210B) such that a temperature (e.g. average, bulk, etc.) of the perovskite material transitions through a temperature and/or temperature range that results in the perovskite material reversibly switching from the first (transparent) phase 210A to the second (absorbing) phase 210B and vice versa.

In some embodiments of the present disclosure, the switchable perovskite material may be switched from the first phase 210A (transparent) to the second phase 210B (opaque) by applying a voltage gradient (e.g. a switching mechanism 220 may apply a voltage gradient). For example, switching the perovskite material from the first phase 210A to the second phase 210B may be achieved by exposing the perovskite material to a voltage source, such that the voltage source transfers sufficient energy to the perovskite material to cause a temperature increase in the perovskite material, such that the higher temperature causes a change in the perovskite material from a first phase 210A to a second phase 210B. The voltage source may cause the switchable material to reach a temperature of greater than about 40° C. for switching the perovskite material from the first (transparent) phase 210A to the second (absorbing) phase 210B. In some embodiments of the present disclosure, the perovskite material may reach a temperature between about 0° C. and about 70° C. to cause the perovskite material to switch from the first phase 210A to the second phase 210B. Such a switching temperature may be a localized temperature and/or a bulk temperature of the switchable perovskite material.

In some embodiments of the present disclosure, a switching mechanism 220 may include a thermal source such as a heating element (e.g. a hot plate), a resistively heated transparent conductor, and/or any other suitable heating device that may transfer energy from the thermal source to the switchable perovskite material (210A and 210B) by convective, conductive, and/or radiant heat-transfer. The heat source may be a light source. The light source may be the sun, a laser, an incandescent lamp, and/or an LED, etc. The switching mechanism may be the application of a magnetic field across the switching material or a reversal of the polarity of the magnetic field. A switching mechanism 220 may remove and/or reduce the intensity of the light provided by a thermal source to switch the perovskite material back from the second (absorbing) phase 210B to the first (transparent) phase 210A. Thus, a thermal source may cause the switchable perovskite material to reach the temperature and/or temperature range needed to switch the perovskite material reversibly between the first phase 210A and the second phase 210B.

A switchable perovskite material may be in the form of a film and/or a layer that may be reversibly switched between the first phase 210A (transparent) and the second phase 210B (opaque), utilizing a switching mechanism 220 similar to those described above. Thus, the switchable perovskite material may be shaped into a specific shape or form, as needed for a specific application. In some embodiments of the present disclosure, a switchable perovskite material may be in the form of spheres, cylinders, rods, and/or cones, etc. In addition, a switchable perovskite material may have at least one textured surface.

FIG. 3 illustrates a switchable photovoltaic device 300 having a transparent phase 300A and an absorbing (e.g. opaque and/or reflective) phase 300B, due to the presence of a switchable perovskite material in the photovoltaic device 300. In some embodiments of the present disclosure, the switchable photovoltaic device 300 includes a perovskite layer 310 that is reversibly switchable, as described above, between a first transparent phase 310A and a second opaque phase 310B (corresponding to reference numerals 210A and 210B, respectively, of FIG. 2), where the perovskite layer 310 is positioned between a first substrate 320A and a second substrate 320B. Thus, the photovoltaic device 300 may be in its transparent phase 300A when the perovskite layer 310 is in its first transparent phase 310A (with the perovskite material in its first phase 210A), and the photovoltaic device 300 may be in an absorbing phase 300B when the perovskite layer 310 is in its second phase 310B (with the perovskite material in its second phase 210B). The perovskite layer 310 may be as thin as 10 nm and as thick as 100 microns. Typical thicknesses may be between 100 nm and 1 micron. The perovskite layer 310 may also be continuous in thickness, varied, or intentionally patterned. The perovskite layer may also be discontinuous in thickness. The patterns may include stripes, circles, or arbitrary shapes. In addition, the photovoltaic device 300 may include an intervening layer 330 positioned between the perovskite layer 300 and the second substrate 320A. A substrate layer (320A and/or 320B) may be a solid and transparent layer such as glass and/or a transparent conducting material (e.g. a transparent conducting oxide (TCO)). A TCO layer may carry electrical current to/from the switchable material layer, for example when the switchable perovskite layer is in the second (absorbing) phase 310B. Such a TCO layer may be porous, dense, and/or patterned and may include but is not limited to: metal, doped metal oxides, and/or carbon-based materials such as graphite, carbon nanotubes, and/or graphene. A substrate layer 320 (see 320A and/or 320B) may provide a physical foundation upon which to construct at least some of the other elements of the photovoltaic device 300 such as the switchable perovskite layer 310. A TCO layer may provide electrical carrier (electron or hole) transport from the switchable perovskite layer (310A and 310B). In general, a substrate layer 320 may be constructed of a high-transmission material such as glass or flexible polymer that may also be used to encapsulate at least some of the layers described herein. A substrate layer may also include a low emissivity (low-c) coating to regulate the amount of ultraviolet and infrared solar radiation from passing through the substrate layer. An additional carrier transport layer may block the transport of one carrier and facilitate the transport of the other.

In some embodiments of the present disclosure, an intervening layer 330 may be substantially transparent and may provide the function of a switching mechanism 220, for example, by acting as a switchable heating source (e.g. a resistive heating element that may be actively turned on and off by a user). In some embodiments, the intervening layer 330 may be substantially transparent and may provide the function of a switching mechanism 220, for example, by acting as switchable electrical current, voltage and/or magnetic biasing source. Thus, an intervening layer 330 may provide an active switching mechanism 230 so that a user may actively and reversibly switch the perovskite layer 310 between the perovskite layer in a first (transparent) phase 310A to the perovskite layer in a second (absorbing) phase 310B.

A device, as described above, may include other elements. For example, a device may include at least one conductor (e.g. fluorine-doped tin oxide, a second conductor (e.g. PEDOT:PSS), and/or one or more carrier transport layers (e.g. titanium oxide, tin oxide, nickel oxide, molybdenum oxide, phenyl-C61-butyric acid methyl ester (PCBM) and/or spiro-OMeTAD). In some embodiments of the present disclosure, a carrier transport layer may be an electron transport layer (ETL), where the ETL may be an optional transparent layer that may be used to extract photo-generated electrons and block hole transport from the switchable perovskite material and/or perovskite layer. ETL materials that may be used in some embodiments of the present disclosure include low-work function inorganic oxides such as doped $TiO_2$, $SnO_x$, and/or ZnO as well as organics-polymers, fullerenes, and/or derivatives such as Phenyl-C61-butyric acid methyl ester (PCBM). In some embodiments of the present disclosure, a carrier transport layer may be a hole transport layer (HTL), where the HTL may be an optional transparent layer used to extract photo-generated holes and block electron transport from the switchable material and/or layer. HTL materials that may be used in some embodiments of the present disclosure are semiconductors such as nickel oxide, copper oxide, copper iodide, and copper thiocyanate. HTL materials may also include organic conductors such as poly(3-hexylthiophene-2,5-diyl) (P3HT), octakis(4-methoxyphenyl)-9,9-spirobi[9H-fluorene]-2,2,7,7-tetramine (spiro-OMeTAD), and/or poly(3,4-ethylenedioythiophene): poly(styrenesulfonate) (PEDOT:PSS). Nanomaterials such as carbon nanotubes, graphene, and quantum dots may also be used to construct an HTL.

FIG. 4 illustrates an example of a photovoltaic device 500 having both a first transparent phase 500A and a second absorbing phase 500B, corresponding to a perovskite layer in a first transparent phase 510A and a perovskite layer in a second absorbing phase 510B, respectively. As described above, the perovskite layer in the first phase 510A corresponds to a perovskite material having a substantially transparent first phase (e.g. phase 210A as shown in FIG. 2), while the perovskite layer in the second phase 510B corresponds to the perovskite material having in a second opaque phase corresponding to the perovskite material having a substantially light-absorbing second phase (e.g. phase 210B of FIG. 2). The photovoltaic device 500 may be reversibly switched between the first transparent phase 500A and the second absorbing phase 500B, by a switching mechanism 220, as described herein. The perovskite layer (510A and 510B) may be positioned between additional elements of a photovoltaic device 500, for example, a hole transport layer 520 and an electron transport layer 530 (e.g. $TiO_2$). The hole and electron transport layers may each have a thickness between 0.1 nm and 10 microns. Typical thicknesses may be between 10 nm and 1 micron. In some embodiments of the present disclosure, the photovoltaic device 500 may include a transparent conducting layer 540 (e.g. a fluorine-doped tin oxide layer). In addition, the perovskite layer (510A and 510B), and the other layers of the photovoltaic device 500 may be positioned between a first substrate 320A and a second substrate 320B. In some embodiments of the present disclosure, at least one of the first substrate 320A and/or the second substrate may be constructed of glass (e.g. a sheet and/or plate of glass).

FIG. 5 illustrates an example of how a photovoltaic device 500, as shown in FIG. 4, may be incorporated into a thermochromic device 600, such as a window. The thermochromic device 600 has a first condition corresponding to the thermochromic device in a first transparent phase 600A, and second condition corresponding to the thermochromic device in a second opaque phase 600B. The thermochromic device in a first phase 600A corresponds to the transparent phase of a photovoltaic device in a first phase 500A (see FIG. 4), when the perovskite material (layer) of the photovoltaic device 500 is substantially in the first transparent phase (see 210A of FIG. 2), described above. The thermochromic device in a second substantially opaque phase 600B corresponds to the photovoltaic device in a second opaque phase 500A (see FIG. 4), when the perovskite material (layer) of the photovoltaic device 500 are substantially in the second opaque phase (see 210B of FIG. 2). As described above, the thermochromic device 600 may be reversibly switched between the two conditions (600A and 600B) using a switching mechanism 220. The switchable perovskite layer (not shown) of the photovoltaic device 500 of the thermochromic device 600 may be isolated from the surrounding environment (e.g. water, oxygen, etc.) by positioning the photovoltaic device 500 within at least one of a first encapsulant 610A and/or a second encapsulant 610B. As shown in FIG. 5, the encapsulant 610 may be in a shape of a layer positioned perpendicular to the long axis of the photovoltaic device 500. The glass substrate layers (not shown) of the photovoltaic device 500, as described for example for FIG. 4, may provide an additional barrier by separating the largest, exposed surface areas of the photovoltaic device from the surrounding environment. Such barriers may maximize the life-span of the perovskite material, perovskite layer, photovoltaic device, and the thermochromic device. For example, the photovoltaic device 500 may be encapsulated by a sandwich structure in which two pieces of glass are on either side of the photovoltaic device and are sealed at the edges with a polymer such as polyisobutylene or silicone. Multiple polymers may be used. Alternatively, the photovoltaic device 500 may be encapsulated by glass on one side and a polymer sheet on the other. The polymer sheet may be made of polyvinylbutyrol, polyvinyl chloride, acrylonitrile, polyethylene terephthalate, among others.

FIG. 6 illustrates a block flow diagram summarizing a method 700 for reversibly switching a device having a switchable perovskite material in a first phase to a second phase using a switching mechanism. The method 700 may include applying a first condition 710 to at least one element of the device (e.g. the switchable layer), such that the first condition 710 maintains the first (transparent) phase of the perovskite material. In addition, the method 700 may include applying a second condition 720 to at least one element of the device (e.g. the switchable perovskite material), such that the second condition 720 results in the change of the perovskite material from the first (transparent) phase to the second (absorbing) phase. As described above, the first condition 710 and/or the second condition 720 may include manipulating the physical conditions of at least one element of the device, including temperatures, pressures, oxidations states, and/or voltages, etc.

Some advantages that may be provided by some of the embodiments described herein include:

1) Switchable layers may be processed from solution for scalable solution processing that may be easily incorporated into current window manufacturing. The layers may be sprayed and used to retrofit existing windows to improve energy efficiency.

2) The use of temperature to switch the switchable layers reversibly between a first phase and a second phase is not fixed and may be tuned to be appropriate for any climate.

3) The color of the absorbing phase may be tuned for an array of aesthetic visible colors and into the infrared. Infrared (IR) absorption is very important for energy-savings to the consumer.

4) The absorbing phase of some of the devices described herein may include photovoltaic elements that are shown herein to harness solar radiation and convert it to electricity.

The perovskite layer may range in thickness to absorb a fraction of the visible spectrum to thicknesses that achieve 100% absorption of visible spectrum. For example, a 10 nm-thick perovskite layer may absorb 10% of the incident light, and perovskite layer that is greater than 10 microns will absorb greater than 99% of the incident light. A thickness on the order of 200 nm to 1 micron is preferred for window applications. This layer may be continuous, discontinuous, or patterned.

FIG. 7 illustrates absorption spectra of switchable $CsPbI_2Br$ thin perovskite layers deposited on fluorine-doped tin oxide (FTO). Reference numeral 310A represents the perovskite layer having a orthorhombic crystal system to provide a first transparent phase, which was significantly transparent in the visible portion of the spectrum. The perovskite layer was annealed to 240° C. for 10 minutes, which switched the perovskite film to a second absorbing phase 310B having a cubic crystal system, represented by reference numeral 310B in FIG. 7; the perovskite film in the cubic crystal system, significantly absorbed visible light. The perovskite film returned to the first phase 310A, having the orthorhombic crystal system, and returned to visibly transparent when left in air at room temperature for about 8 minutes. The insets show photographs of the films in both phases. It is notable that the cubic-to-orthorhombic switch was accelerated in air, which suggests adsorption of a gaseous species, such as water or oxygen, at crystalline interfaces may accelerate the phase transition. No intercalation of water was observed. The perovskite layer was formed using the following procedure: $CsBr_2$ and $PbI_2$ were dissolved in DMF to yield a 1:1 mol ratio, 0.45M solution. $CsPbI_2Br$ films were deposited from this solution onto the fluorine-doped tin oxide (FTO) pre-deposited on glass substrates by spin-coating at 2000 rpm for 2 minutes after which the layers were annealed at 330° C. for 10 minutes to yield the switchable $CsPbI_2Br$ perovskite layers.

FIG. 8 illustrates temperature-dependent X-ray diffraction results from tests performed on the perovskite layer described in FIG. 7. The perovskite layer started with an orthorhombic crystal system (transparent) and was ramped up in temperature at a rate of 1° C. $min^{-1}$. X-ray diffraction patterns were continuously acquired during the process to render a two-dimensional plot of time versus 2θ where color corresponds to x-ray intensity. A gradual change from the orthorhombic crystal system, indicated by its intense reflection at 26°, to the cubic crystal system, with its characteristic intense reflection at 30°, was observed from 100° C. to 240° C. FIG. 9 illustrates temperature-dependent X-ray diffraction patterns extracted from the data shown in FIG. 8 at temperatures that show the phase transition from orthorhombic to cubic crystal systems. At 210° C., the orthorhombic phase dominates, characterized by the reflections at 27 degrees. The cubic crystal system began to emerge at 220° C., characterized by prominent reflections at 15 and 30 degrees. The features grow in intensity as the temperature is increased to 270° C. FIG. 10 illustrates theoretically-calculated X-ray diffraction patterns for the cubic (perovskite)

and orthorhombic perovskite crystal systems and compares to experimentally obtained patterns. Each phase (first transparent phase and second opaque phase) shows good agreement and no sign of significant texturing.

FIG. 11 illustrates current density-voltages curves of a photovoltaic device fabricated with a photovoltaic layer composed of $CsPbI_2Br$. The top curve represents the initial device performance fabricated with the perovskite layer in the cubic crystal system (the second absorbing phase). The curve second from the bottom represents the same device after the $CsPbI_2Br$ was transformed into the orthorhombic crystal system (the first transparent phase). Note the device was still photovoltaically active while in the visibly transparent (orthorhombic) phase. The device was annealed to 240° C. on a hotplate to return it to the opaque (cubic) phase. The curve third from the top represents the device performance after this cycling process. This device of FIG. 11 was fabricated using the following procedure: A $TiO_2$ layer was deposited on fluorine-doped tin oxide (FTO) glass by spin-coating a 0.15M solution of titanium diisopropoxide bis (acetylacetonate) in 1-butanol with the following procedure: 700 rpm for 10 s, 1000 rpm for 10 s, and 2000 rpm for 30 s. The films were then annealed at 500° C. for 1 hr to form 20-40 nm thick compact $TiO_2$ films. $CsBr_2$ and $PbI_2$ were dissolved in DMF to yield a 1:1 mol ratio, 0.45M solution. The $CsPbI_2Br$ films were deposited from this solution onto the $FTO/TiO_2$ substrates by spin-coating at 2000 rpm for 2 minutes after which the films were annealed at 330° C. for 10 minutes to yield the switchable $CsPbI_2Br$ layers. The $CsPbI_2Br$ perovskite layers were cooled to room temperature and a N2,N2,N2',N2',N7,N7,N7',N7'-octakis(4-methoxyphenyl)-9,9'-spirobi[9H-fluorene]-2,2',7,7'-tetramine (sprio-OMeTAD) hole transport material was deposited by spin-coating at 5000 rpm for 30 s from a solution containing 72 mg spiro-OMeTAD, 28.8 µL 4-tert-butyl pyradine, 17.5 µL of a Bis(trifluoromethane)sulfonimide lithium salt (LiTFSI) stock solution (520 mg/mL in acetonitrile), 29 µL of a tris(2-(1H-pyrazol-1-yl)-4-tert-butylpyridine)cobalt(III)-tris(bis(trifluoromethylsulfonyl) imide) FK209) stock solution (300 mg/mL in acetonitrile), in 1 mL of chlorobenzene. The devices were stored in a desiccator overnight and then completed by evaporating 100 nm of Au through a shadow mask. The performance metrics of this device are tabulated in Table 1 below.

TABLE 1

Photovoltaic performance metrics of the device described in FIG. 11.

| Crystalline Phase | $V_{OC}$ (V) | $J_{SC}$ (mA/cm$^2$) | Fill Factor | Eff (%) |
|---|---|---|---|---|
| Perovskite | 1.05 | 10.53 | 0.655 | 7.22 |
| Orthorhombic | 0.60 | 0.42 | 0.403 | 0.10 |
| Perovskite | 0.88 | 7.79 | 0.368 | 2.53 |

FIG. 12 shows absorption properties of perovskite layers composed of $CsPbI_2Br$ deposited on glass. The perovskite layer was switched from a transparent first phase (dashed) to a tinted second phase (solid) by annealing the transparent film in a $N_2$-atmosphere glove box to 240° C. for 10 minutes. The tinted film was cooled to room temperature (~25° C.), and it maintained the tinted color. The perovskite film was reversed from the tinted second phase to the transparent first phase by removing it from the glovebox and exposing it to water vapor in the air, which triggered the perovskite crystal system to transform to the transparent phase within 10 minutes. This color cycle procedure was performed six times consecutively, and absorption spectra were obtained for each color during each cycle. This demonstrates repeated switching over a long lifetime is possible.

Perovskite Layers Composed of $(NH_2CHNH_3)_{0.2}Cs_{0.3}$ $(CH_3NH_3)_{0.5}Pb_{0.5}Sn_{0.5}I_{2.1}Br_{0.9}$ were deposited on glass. The layer was dipped in a solvent bath (e.g. hexane, octane) that contained dilute (0.1 mM) 4-Phenyldiazenylbenzoic acid. Phenyldiazenylbenzoic acid remained in the layer after removing it from the bath. This molecule acts as a trigger for phase transformation. When the phenyldiazenylbenzoic acid-treated perovskite layer was heated to 40° C. in a $N_2$ atmosphere, it switched from the transparent first phase to the tinted second phase. Upon cooling to 20° C. in the $N_2$ atmosphere, the layers switched back from the tinted second phase to the transparent first phase. Thus, some embodiments of the present invention, switchable devices as described herein may further include a molecule that assists with switching the device between a first transparent phase and a second opaque phase. Without wishing to be bound by theory, such a "triggering" molecule may interact with the perovskite material contained in the device to assist with the switching between phases. By "assisting", a triggering molecule may increase the kinetics (e.g. decrease the time) of the switching between phases, or reduce the magnitude or delta between the switching criteria. For example, the presence of a switching molecule may enable the switching of the device between its first transparent phase and second opaque phase to occur at lower temperatures, lower pressures, lower voltages, etc. Although, a triggering molecule may intercalate into the perovskite material, this is not the only mechanism possible, and the scope of the present disclosure includes other interactions such as the triggering molecule interacting with only the interfaces and/or outside surfaces of the perovskite material. In some embodiments of the present disclosure, a triggering molecule may physically interact with the outside surface of a switchable perovskite material by physically adsorbing to the surfaces (e.g. non-covalent interactions such as electrostatic interactions and Van der Waals forces). A triggering molecule may be present on the outside surfaces of the switchable perovskite as at least one of a solid, liquid, and/or gas. One example of a triggering molecule is phenyldiazenylbenzoic acid. Other examples of triggering molecules include water, alcohols, and other organic molecules. Examples of alcohols include primary, secondary, and/or tertiary alcohols, with specific examples including methanol and/or ethanol. Examples of organic molecules include molecules with an organic constituent, such as linear alkyl groups (methyl-, ethyl-, propyl-, octyl-, etc.), branched alkyls (2-propyl, 3-butyl, etc.), cyclic (cyclohexyl, etc.), and conjugated species (benzyl, etc.). Other examples of triggering molecules include organic molecules having at least one of hydroxy, thiol, amine, carboxylic acid, nitrile, ketone, ester, phosphine, ammonium, carboxylate, and/or phosphonate groups.

Perovskite layers composed of $Cs_{0.5}(CH_3NH_3)_{0.5}$ $PbI_{2.1}Br_{0.9}$ were deposited on glass. The layers were placed in a chamber containing 50 torr partial pressure of methanol, which was balanced with argon. The chamber was sealed and no gas was allowed in or out. When the perovskite layer was heated to 40° C., it switched from a transparent first phase to a tinted second phase. Upon cooling to 20° C., the layers switched back from a tinted second phase to the transparent first phase.

EXAMPLES

Example 1

A device comprising: a perovskite, wherein: when a first condition is met, at least a portion of the perovskite is in a first phase that substantially transmits light, when a second condition is met, at least a portion of the perovskite is in a second phase that substantially absorbs light, and the perovskite is reversibly switchable between the first phase and the second phase by reversibly switching between the first condition and the second condition.

Example 2

The device of Example 1, wherein the first phase comprises a first crystal system selected from the group consisting of triclinic, monoclinic, orthorhombic, tetragonal, trigonal, hexagonal, rhombohedral, hexagonal, and cubic.

Example 3

The device of Example 2, wherein the first crystal system is selected from the group consisting of orthorhombic, tetragonal, and trigonal.

Example 4

The device of Example 1, wherein the second phase comprises a second crystal system selected from the group consisting of triclinic, monoclinic, orthorhombic, tetragonal, trigonal, hexagonal, rhombohedral, hexagonal, and cubic.

Example 5

The device of Example 4, wherein the second crystal system is cubic.

Example 6

The device of Example 1, wherein the first phase is different than the second phase.

Example 7

The device of Example 6, wherein: the first phase comprises an orthorhombic crystal system, and the second phase comprises a cubic crystal system.

Example 8

The device of Example 1, wherein: the first phase comprises a first crystal system having a first symmetry, and the second phase comprises a second crystal system having a second symmetry.

Example 9

The device of Example 8, wherein the first crystal system is substantially the same as the second crystal system.

Example 10

The device of Example 9, wherein the first symmetry is selected from the group consisting of P222, Pmm2, Pm-3m, Pba2, Cmca, Cmmm, Imma, pnma, Amm2,P6, P2n3, 1432, P 4/m 3 2/m, and F 2/d 3.

Example 11

The device of Example 10, wherein: the second symmetry is selected from the group consisting of P222, Pmm2, Pm-3m, Pba2, Cmca, Cmmm, Imma, pnma, Amm2, P6, P2n3, 1432, P 4/m 3 2/m, and F 2/d 3, and the second symmetry is different from the first symmetry.

Example 12

The device of Example 11, wherein: the first crystal system and the second crystal system are both substantially orthorhombic, the first symmetry is Amm2, and the second symmetry is Pmnb.

Example 13

The device of Example 8, wherein the first crystal system is substantially different than the second crystal system.

Example 14

The device of Example 13, wherein: the first crystal system comprises a first symmetry, and the second phase comprises a second symmetry.

Example 15

The device of Example 14, wherein the first symmetry is selected from the group consisting of P222, Pmm2, Pm-3m, Pba2, Cmca, Cmmm, Imma, pnma, Amm2,P6, P2n3, 1432, P 4/m 3 2/m, and F 2/d 3.

Example 16

The device of Example 15, wherein the second symmetry is selected from the group consisting of P222, Pmm2, Pm-3m, Pba2, Cmca, Cmmm, Imma, pnma, Amm2, P6, P2n3, 1432, P 4/m 3 2/m, and F 2/d 3.

Example 17

The device of Example 16, wherein: the first crystal system is orthorhombic, the second crystal system is cubic, the first symmetry is Pmnb, and the second symmetry is Pm-3m.

Example 18

The device of Example 16, wherein: the first crystal system is orthorhombic, the second crystal system is cubic, the first symmetry is pnma, and the second symmetry is P2n3.

Example 19

The device of Example 16, wherein: the first crystal system is hexagonal, the second crystal system is selected from the group consisting of tetragonal and trigonal, the first symmetry is P6, and the second symmetry is selected from the group consisting of 1432, P 4/m 3 2/m, and F 2/d 3.

Example 20

The device of Example 16, wherein P6 comprises at least one of P62c or P6mm.

Example 21

The device of Example 1, wherein, when the second condition is met, at least a portion of the light absorbed by the perovskite is converted to a current.

Example 22

The device of Example 1, wherein, when the second condition is met, the light absorbed has a wavelength between 390 nm to 700 nm.

Example 23

The device of Example 1, wherein, when the first condition is met, the light transmitted has a wavelength between 390 nm to 700 nm.

Example 24

The device of Example 1, further comprising, when the first condition is met, a portion of light is absorbed by the perovskite and converted to a current.

Example 25

The device of Example 24, wherein, when the second condition is met, the portion of light absorbed has a wavelength between 390 nm to 700 nm.

Example 26

The device of Example 1, wherein: the perovskite comprises at least one of $ABX_3$, $ABX_4$, $A_2BX_6$, or $A'_2A''_{n-1}B_nX_{3n+1}$, A, A', and A'' comprise a first cation, A' is different than A'', B comprises a second cation that is different from A, A', and A'', X comprises an anion, and $0 \leq n \leq 5$.

Example 27

The device of Example 26, wherein the first cation comprises at least one of a monovalent or a divalent cation.

Example 28

The device of Example 26, wherein the second cation comprises a metal that is in at least one of a 2+ oxidation state, a 3+ oxidation state, or a 4+ oxidation state.

Example 29

The device of Example 26, wherein the anion comprises at least one of thiocyanate, a halide, or a chalcogenide.

Example 30

The device of Example 26, wherein the perovskite comprises $ABX_3$, wherein the first cation comprises cesium, the second cation comprises lead, and the anion comprises at least one of iodine or bromine.

Example 31

The device of Example 30, wherein the perovskite comprises $CsPbI_2Br$.

Example 32

The device of Example 26, wherein the first cation comprises at least one of methylammonium or formammidinium.

Example 33

The device of Example 1, wherein the first condition is achieved when the perovskite attains a first temperature below 200° C.

Example 34

The device of Example 33, wherein the first temperature is below 40° C.

Example 35

The device of Example 34, wherein the first temperature is below 20° C.

Example 36

The device of Example 1, wherein the second condition is achieved when the perovskite attains a second temperature above 15° C.

Example 37

The device of Example 36, wherein the second temperature is above 40° C.

Example 38

The device of Example 37, wherein the second temperature is above 200° C.

Example 39

The device of Example 1, wherein the first condition is achieved when the perovskite attains a first temperature between 20° C. and 200° C.

Example 40

The device of Example 39, wherein the second condition is achieved when the perovskite attains a second temperature that is between 5 and 100° C. higher than the first temperature.

Example 41

The device of Example 40, wherein the second condition is achieved when the perovskite attains a second temperature that is between 5 and 20° C. higher than the first temperature.

Example 42

The device of Example 1, wherein the perovskite is in the form of a layer.

Example 43

The device of Example 1, further comprising: a first transparent conducting layer; and a second transparent conducting layer, wherein: the perovskite layer is positioned between the first transparent conducting layer and the second conducting layer.

Example 44

The device of Example 1, further comprising: a switching mechanism having a first position and a second position, wherein: when in the first position, the first condition is met, and when in the second position, the second condition is met.

Example 45

The device of Example 44, wherein: the switching mechanism comprises a light source, when in the first position, the light is off, and when in the second position, the light is on.

Example 46

The device of Example 44, wherein: the switching mechanism comprises a voltage source applied to the device, when in the first position, the voltage source does not apply a voltage to the device, and when in the second position, the voltage source applies a voltage to the device.

Example 47

The device of Example 43, further comprising an intervening layer positioned adjacent to the perovskite layer, wherein the voltage is applied to the intervening layer.

Example 48

The device of Example 1, wherein: the perovskite further comprising a surface; and a molecule, wherein: the molecule physically interacts with the surface to assist with the switching.

Example 49

The device of Example 48, wherein the molecule assists with the switching by at least one of decreasing a time needed to switch between the first phase and the second phase or decreasing a difference between a first temperature and a second temperature corresponding to the first phase and the second phase, respectively.

Example 50

The device of Example 49, wherein the molecule comprises at least one of a water or an organic molecule.

Example 51

The device of Example 50, wherein the molecule comprises at least one of phenyldiazenylbenzoic acid or an alcohol.

Example 52

A method comprising: reversibly switching a perovskite between a first phase and a second phase by manipulating a condition of the perovskite wherein: when in the phase, the perovskite is substantially transparent to light in the visible spectrum, and when in the second phase, the perovskite absorbs at least a portion of light in the visible spectrum.

Example 53

The method of Example 52, wherein the method further comprises generating electricity while in the second phase.

Example 54

The method of Example 52, wherein the method further comprises generating electricity while in the first phase.

Example 55

The method of Example 52, wherein the switching is achieved by at least one of changing a temperature of the perovskite, applying a voltage to the perovskite, changing a pressure of the perovskite, exposing a surface of the perovskite to a molecule, or removing the molecule from the surface.

Example 56

The method of Example 55, wherein the switching is achieved by changing the temperature of the perovskite by a delta between 5° C. and 200° C.

Example 57

The method of Example 56, wherein the delta is between 5° C. and 50° C.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:
1. A thermochromic window comprising:
a perovskite layer comprising $(NH_2CHNH_3)_{0.2}Cs_{0.3}(CH_3NH_3)_{0.5}Pb_{0.5}Sn_{0.5}I_{2.1}Br_{0.9}$; and
a triggering molecule comprising phenyldiazenylbenzoic acid, wherein:
a voltage source is configured to provide energy to the perovskite layer to heat the perovskite layer from a first temperature to a second temperature,
when at the first temperature, at least a portion of the perovskite layer is in a first phase that substantially transmits light,
when at the second temperature, at least a portion of the perovskite layer is in a second phase that substantially absorbs light, and
the perovskite layer is reversibly switchable between the first phase and the second phase by reversibly switching between the first temperature and the second temperature.

2. The thermochromic window of claim 1, wherein the first phase comprises a first crystal system selected from the group consisting of triclinic, monoclinic, orthorhombic, tetragonal, trigonal, hexagonal, rhombohedral, hexagonal, and cubic.

3. The thermochromic window of claim 2, wherein the second phase comprises a second crystal system selected from the group consisting of triclinic, monoclinic, orthorhombic, tetragonal, trigonal, hexagonal, rhombohedral, hexagonal, and cubic.

4. The thermochromic window of claim 1, wherein:
the first phase comprises an orthorhombic crystal system, and
the second phase comprises a cubic crystal system.

5. The thermochromic window of claim 3, wherein:
the first phase comprises a first crystal system having a first symmetry, and
the second phase comprises a second crystal system having a second symmetry.

6. The thermochromic window of claim 5, wherein the first symmetry is selected from the group consisting of P222, Pmm2, Pm-3m, Pba2, Cmca, Cmmm, Imma, pnma, Amm2, P6, P2n3, I432, P 4/m 3 2/m, and F 2/d 3.

7. The thermochromic window of claim 6, wherein the second symmetry is selected from the group consisting of P222, Pmm2, Pm-3m, Pba2, Cmca, Cmmm, Imma, pnma, Amm2, P6, P2n3, I432, P 4/m 3 2/m, and F 2/d 3.

8. The thermochromic window of claim 7, wherein:
the first crystal system and the second crystal system are both substantially orthorhombic,
the first symmetry is Amm2, and
the second symmetry is Pmnb.

9. The thermochromic window of claim 7, wherein:
the first crystal system is orthorhombic,
the second crystal system is cubic,
the first symmetry is Pmnb, and
the second symmetry is Pm-3m.

10. The thermochromic window of claim 7, wherein:
the first crystal system is orthorhombic,
the second crystal system is cubic,
the first symmetry is pnma, and
the second symmetry is P2n3.

11. The thermochromic window of claim 7 wherein:
the first crystal system is hexagonal,
the second crystal system is selected from the group consisting of tetragonal and trigonal,
the first symmetry is P6, and
the second symmetry is selected from the group consisting of I432, P 4/m 3 2/m, and F 2/d 3.

12. The thermochromic window of claim 1, wherein, when in the second phase at least a portion of the light absorbed by the perovskite layer is converted to a current.

13. The thermochromic window of claim 1, wherein, when in the first phase, a portion of light is absorbed by the perovskite layer and converted to a current.

14. The thermochromic window of claim 1, wherein the first temperature is less than or equal to 200° C.

15. The thermochromic window of claim 1, wherein the second temperature is between 5° C. and 20° C. higher than the first temperature.

16. The thermochromic window of claim 1, wherein the voltage source is configured to supply a voltage across the perovskite layer between −20 volt and 20 volts.

17. The thermochromic window of claim 1, further comprising:
a resistive heating element positioned adjacent to the perovskite layer, wherein:
the voltage source applies a first voltage to the resistive heating element, resulting in the first temperature, and
the voltage source applies a second voltage to the resistive heating element, resulting in the second temperature.

* * * * *